United States Patent [19]
Shibata et al.

[11] Patent Number: 5,973,535
[45] Date of Patent: Oct. 26, 1999

[54] SEMICONDUCTOR CIRCUIT USING FEEDBACK TO LATCH MULTILEVEL DATA

[75] Inventors: Tadashi Shibata, 5-2, Nihondaira, Taihaku-ku, Sendai-shi, Miyagi-ken 982-02; Tadahiro Ohmi, 1-17-301, Komegabukuro 2-chome, Abba-ku, Sendai-shi, Miyagi-ken, 980; Takeo Yamashita, Sendai, all of Japan

[73] Assignees: Tadahiro Ohmi; Tadashi Shibata, both of Miyagi-ken, Japan

[21] Appl. No.: 08/666,506

[22] PCT Filed: Dec. 27, 1994

[86] PCT No.: PCT/JP94/02258

§ 371 Date: Jun. 28, 1996

§ 102(e) Date: Jun. 28, 1996

[87] PCT Pub. No.: WO95/18488

PCT Pub. Date: Jul. 6, 1995

[30] Foreign Application Priority Data

Dec. 28, 1993 [JP] Japan ................................. 7-352086

[51] Int. Cl.$^6$ ....................................................... H03K 5/08
[52] U.S. Cl. ............................. 327/333; 327/363; 326/60
[58] Field of Search ..................................... 327/333, 363, 327/403, 404, 405, 415, 104, 184; 326/59, 60, 63

[56] References Cited

U.S. PATENT DOCUMENTS

| | | | |
|---|---|---|---|
| 4,814,644 | 3/1989 | Yamakawa | 326/60 |
| 4,821,286 | 4/1989 | Graczyk et al. | 326/59 |
| 4,823,028 | 4/1989 | Lloyd | 326/59 |
| 5,132,575 | 7/1992 | Chern | 326/59 |

FOREIGN PATENT DOCUMENTS

| | | |
|---|---|---|
| 60-7278 | 2/1985 | Japan . |
| 61-133718 | 6/1986 | Japan . |
| 3-6679 | 1/1991 | Japan . |
| 3-144785 | 6/1991 | Japan . |

*Primary Examiner*—Tim Callahan
*Assistant Examiner*—An T. Luu
*Attorney, Agent, or Firm*—Randall J. Knuth

[57] ABSTRACT

A simple semiconductor circuit by which analog data or multilevel data can be fetched and stored. The circuit receives a first signal and converts the first signal into a second signal composed of multilevel. The second signal is fed back to the circuit. The circuit is constituted of a first circuit which converts the first signal into a signal group composed of multiple quantized signals and second circuit which converts the signal group into the second signal. In addition, the first or/and second circuits are constituted of one or more neuron MOS transistors.

12 Claims, 20 Drawing Sheets

FIG. 15
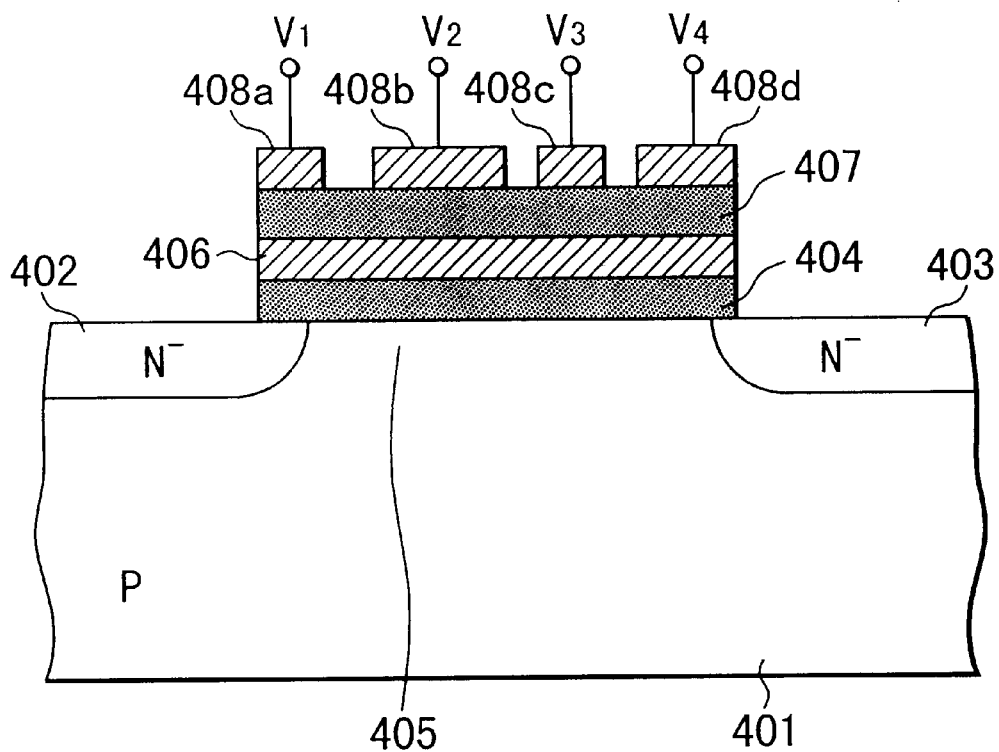
(a)
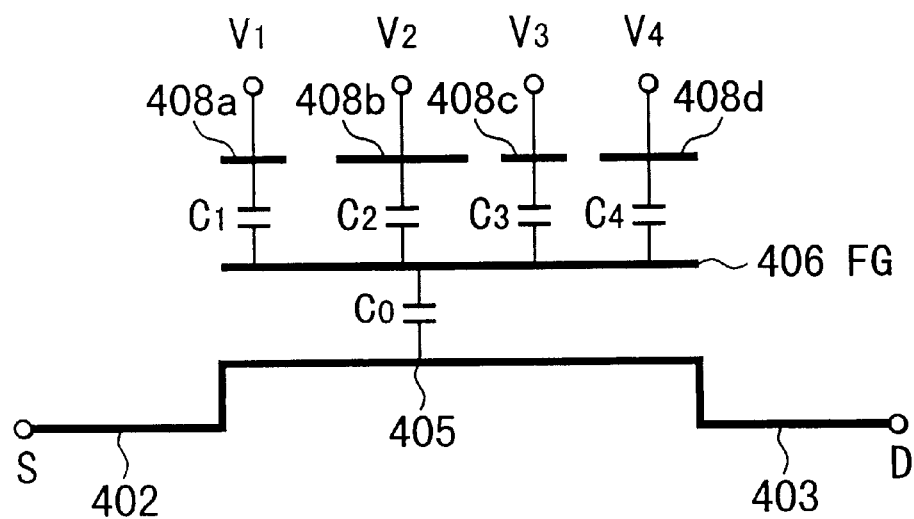
(b)

SEMICONDUCTOR CIRCUIT USING FEEDBACK TO LATCH MULTILEVEL DATA

TECHNICAL FIELD

The present invention relates to a semiconductor circuit, and in particular, relates to a highly functional semiconductor integrated circuit which is capable of converting analog data into multilevel data and storing these data in a static manner.

BACKGROUND

The signal processing of video camera images and the like has conventionally been accomplished by means of converting an enormous amount of analog data fetched by an image sensor into a digital format, and conducting processing by means of a digital computer.

When such a method is employed in concert with an increase in the number of pixels, the amount of data to be processed increases greatly, and it becomes impossible to conduct signal processing in real time. It is thus necessary to conduct signal processing completely in parallel at a hardware level, whether the inputted data is in an analog or multilevel format; however, in order to accomplish this, a circuit is rehired to temporarily store the analog or multilevel data incorporated by the sensor or data representing intermediate calculations.

However, in order to realize circuitry such as that conventionally known, a large number of elements was required, and furthermore, because the addition of the multilevel data was accomplished by means of the addition of electrical current, the amount of power consumed was large and it was thus difficult to conduct signal processing in a completely parallel format at the hardware level among the data fetched by the pixel sensors.

It is an object of the present invention to provide a semiconductor circuit which is capable of fetching and storing analog or multilevel data using simple circuitry.

DISCLOSURE OF THE INVENTION

The semiconductor circuit in accordance with the present invention is characterized in that a first signal which is inputted is converted into a second signal comprising a predetermined multilevel signal and is outputted, and this second signal is then fed back to the circuit.

The circuit is characterized in comprising a first circuit, which converts the first signal into a signal group comprising multiple quantized signals, and a second circuit which converts this signal group into the second signal.

Furthermore, the first circuit and/or the second circuit are characterized in constituting 1 or more neuron MOS transistors, having: a semiconductor region of a first conductivity type provided on a substrate, source and drain regions of an opposite conductivity type provided on this region, a floating gate electrode which is in a potentially floating state and is provided via an insulating film at a region separating the source and drain regions, and a plurality of input gates which are capacitively coupled with the floating gate electrode via an insulating film.

Function

A first signal which is inputted is converted into a second signal comprising a predetermined multilevel signal, and the second signal is fed back to the circuit, and thereby, it is possible to construct a multilevel signal memory.

For example, by means of constituting the circuit with a first circuit which converts a first signal which is inputted into a signal group comprising multiple quantized signals, and a second circuit which converts this signal group into a second signal comprising a multilevel signal, and by feeding back the second signal to the input part of the first circuit, it is possible to construct a circuit which converts a first signal inputted in an analog or multilevel format into a predetermined multilevel signal (second signal) and latches this.

Furthermore, by means of constituting the first circuit or second circuit using neuron MOS, it is possible to greatly reduce the number of elements and power consumption required.

BRIEF DESCRIPTION OF THE DIAGRAMS

FIG. 15 is a schematic diagram showing the structure and function of vMOS.

| (Description of the References) | |
|---|---|
| 108 | switch, |
| 109, 110, 111, 112 | NMOS transistors, |
| 113, 114, 115 | resistors, |
| 116 | operational amplifier, |
| 117, 118, 119, 120 | CMOS inverters, |
| 125 | operational amplifier input terminal, |
| 127 | CMOS switch, |

-continued (Description of the References)

| | |
|---|---|
| 128 | NMOS, |
| 129 | PMOS, |
| 130 | inverter, |
| 202 | A/D convertor, |
| 211, 212, 214 | resistors, |
| 217 | switch, |
| 302, 303, 306, 307 | inverter circuits, |
| 310 | floating gate, |
| 311 | N channel neuron MOS transistor, |
| 312 | P channel neuron MOS transistor, |
| 314 | switch, |
| 315 | C-vMOS source follower, |
| 317, 318 | floating gates, |
| 321, 322 | v-CMOS inverters, |
| 331, 332, 338, 339, 347, 348 | switches, |
| 344, 345 | inverters, |
| 349, 350, 363, 369 | floating gates, |
| 356, 357, 359, 360 | inverters, |
| 367 | analog inverter, |
| 372 | v-CMOS inverter, |
| 373 | switch, |
| 401 | silicon substrate, |
| 402, 403 | source and drain, |
| 404 | gate insulating film, |
| 405 | channel, |
| 406 | floating gate electrode, |
| 407 | insulating film, |
| 408a, 408b, 408c, 408d | input gates, |
| 506–508 | inverters, |
| 509 | A/D converter, |
| 510 | C-vMOS source follower circuit, |
| 512 | circuitry for fetching inputted data from the exterior to the circuit. |

BEST MODE FOR CARRYING OUT THE INVENTION

Hereinbelow, the present invention will explained in detail using embodiments; however, it is of course the case that the present invention is in no way limited to the embodiments described.

(Embodiment 1)

Figure 1:
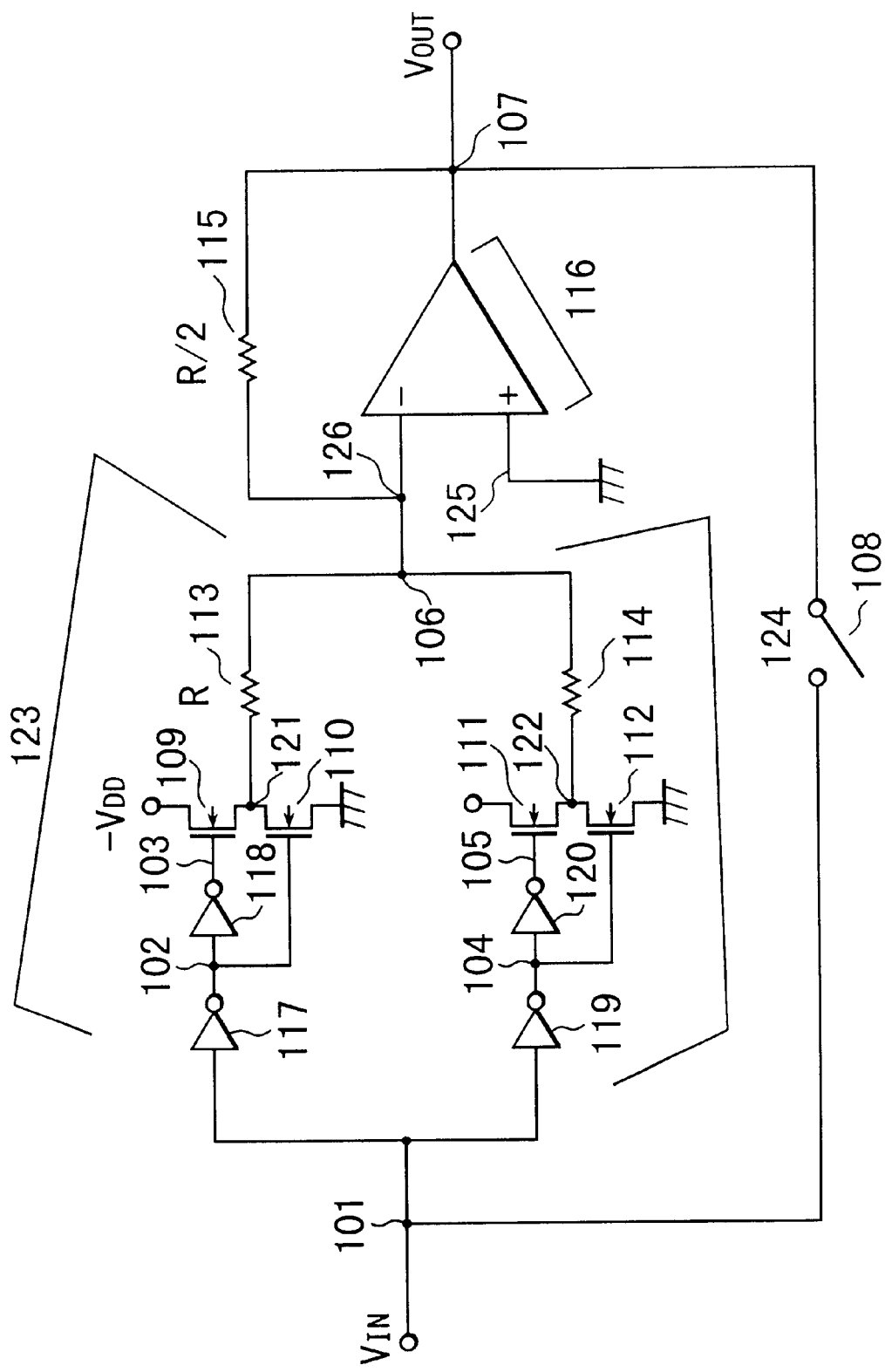
FIG. 1 is a circuit diagram showing a first embodiment of the present invention.

A first agent of the present invention will explained using the circuit shown in FIG. 1.

In FIG. 1, references 117, 118, 119, and 120 indicate CMOS inverters, while references 109, 110, 111, and 112 indicate NMOS transistors. References 113, 114, and 115 indicate resistors having resistance values of, respectively R, R, and R/2; these may be produced on the chip by means of, for example, polysilicon.

Reference 116 indicates an operational amplifier; this circuit amplifies and outputs the difference between the voltage of input terminal 125 and the voltage of 106. This operational amplifier may be realized using common MOS transistors or bipolar transistors. The output 107 of the operational amplifier is fed back to input 126 via resistor 115, and the other input 125 is grounded.

Furthermore, the output 107 of the operational amplifier can be fed back to input 101 via switch 108.

MOS 109 and 111 have sources which are connected to a power source of $-V_{DD}$ (for example, $-5V$), and they are designed so that when the difference between the respective gate voltages (103, 105) and the source voltage ($-V_{DD}$) exceeds a threshold value (for example, 5V), the transistors enter an ON state. Furthermore, the drains of NMOS 110 and 112 are grounded, and these transistors are designed so that when the difference between the respective gate voltages (102, 104) and the source voltage exceeds a threshold value (for example, 5V) the transistors enter an ON state.

The relationship of output 107 with respect to input 101 is shown in FIG. 2(a). Here, the inversion threshold values of inverters 117 and 119 are set to, respectively, $V_{DD}/4$ (for example, (5/4)V), and $3V_{DD}/4$ (for example, (15/4)V), and the threshold values of 118 and 120 are set to $V_{DD}/2$, and when switch 108 is placed in an OFF position, nodes 107 and 101 are electrically cut off from one another.

If the ON resistances of transistors 109, 110, 111, and 112 are set so as to be sufficiently smaller than resistors 113, 114, and 115, then the current flowing through transistors 109 and 110, and 111 and 112, will be essentially identical.

If the voltage, of input 101 is within a range of $0V-V_{DD}/4$, then the voltage of nodes 103 and 105 becomes 0V while the voltage of nodes 102 and 104 becomes $V_{DD}$, and in order that the current of transistors 109 and 110, and 111 and 112, be equal, the voltage of nodes 121 and 122 is set to 0V. At this time, transistors 109, 110, 111, and 112 are all Mating near their threshold values.

Operational amplifier 116 causes a current to flow to resistors 113, 114, and 115, and operations are conducted so that the difference in potential between inputs 106 and 125 approaches 0. Commonly, the operational amplifier has a sufficiently large input impedance, so that the current flowing into the input terminal of the operational amplifier is assumed to be 0, and thus the sun of the currents flowing through resistors 113 and 114 and the current flowing through resistor 115 may be considered to be equivalent.

Now, if the potential of nodes 121 and 122 is 0V, then there is no difference in potential between the two ends of resistors 113 and 114, and because no current flows, no current flows to resistor 115, and the output of 107 becomes 0V.

If the voltage of input 101 is within a range of $V_{DD}/4-3V_{DD}/4$, then the voltage of node 103 is $V_{DD}$, and the voltage of node 102 is 0V, transistor 109 enters an ON state, and transistor 110 enters an OFF state, so that the potential of node 121 changes in the direction of $-V_{DD}$. If the ON resistance of NMOS 109 and 111 is set so as to be sufficiently small in comparison with that of resistors 113, 114, and 115, then the potential of node 121 is essentially $-V_{DD}$, a difference in potential of $-V_{DD}$ is produced between the two ends of resistor 113, and a current of $-V_{DD}/R$ flows.

The voltage of node 122 is still 0, so that a current does not flow to resistor 114, and thus the current flowing through resistor 115 is in agreement with the current flowing through resistor 113, and is thus $-V_{DD}/R$. Accordingly, at this time, a difference in potential of $(V_{DD}/R) \times (R/2) = V_{DD}/2$ is generated between the ends of resistor 115, and the output voltage 107 becomes $V_{DD}/2$.

If the voltage of input 101 is within a range of $3V_{DD}/4-V_{DD}$, then transistors 109 and 111 both enter an ON state, and transistors 110 and 112 enter an OFF state, so that the potential of nodes 121 and 122 changes in the direction of $-V_{DD}$. At this time, the current flowing through resistor 115 in identical to the sum of the currents flowing through resistors 113 and 114, and becomes $-2V_{DD}/R$. A difference in potential of $(2V_{DD}/R) \times (R/2) = V_{DD}$ is produced between the two ends of resistor 115, and the output voltage 107 becomes $V_{DD}$.

The operating point of the circuit when switch 108 is in an ON state is shown in FIG. 2(b). The voltages of input node 101 and output node 107 are equivalent, so that the stable operational points of the circuit are represented by the intersection points of the characteristics of FIG. 2(a) and the $V_{IN}=V_{OUT}$ characteristics. In FIG. 2(b), the unstable operational points are points at which, even though they are points of intersection, the circuit operates in an unstable manner.

The operation of the circuit as a whole can be explained in the following manner; when a signal having a voltage within a range of 0 $-V_{DD}/4$ is inputted into node 101, then 0V is outputted to node 107, and by closing switch 108, the potential of node 101 is latched to 0V, and a signal voltage of 0 is maintained.

When a signal having a voltage within a range of $V_{DD}/4-3V_{DD}/4$ is inputted into node 101, $V_{DD}/2$ is outputted to node 107, and by closing switch 108, the potential of node 101 is latched to $V_{DD}/2$ and a signal voltage of $V_{DD}/2$ is maintained.

Furthermore, when a signal having a voltage within a range of $3V_{DD}/4 - V_{DD}$ is inputted into node 101, then $V_{DD}$ is outputted to node 107, and by closing switch 108, the potential of node 101 is latched to $V_{DD}$, and a signal voltage of $V_{DD}$ is maintained.

Figure 3:
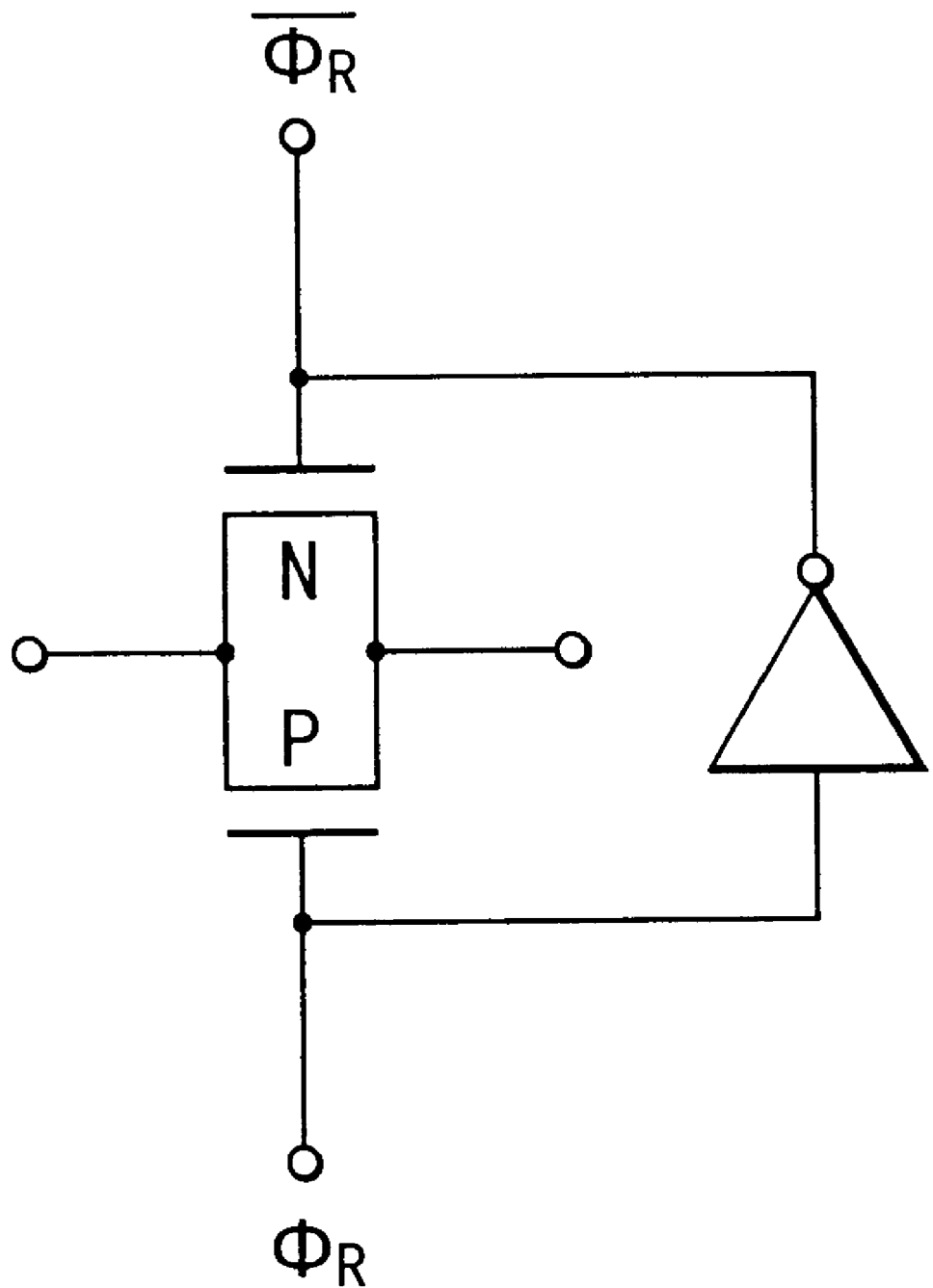
FIG. 3 is a circuit diagram showing a CMOS switch which is preferably employed in the first circuit.

In this manner, the circuit converts an input signal inputted in analog or multilevel format into a predetermined multilevel signal and latches this, Switch 109 may be realized by means of NMOS or PMOS transistors; however, at this time, the boot strap circuit method may be introduced, and the gate voltage may be set so as to be sufficiently high in the case of NOMS, and set so as to be low in the case of PMOS, and the cut off of the transistors when the output voltage becomes large or becomes small may thus be prevented. Furthermore, the use of the CMOS switch depicted in FIG. 3 will make the voltage at both ends of the switch equivalent, and thus more stable circuit operations can be obtained.

In FIG. 1, the values of resistors 113, 114, and 115 may be appropriately altered and a circuit identical to 123 and 124 may be added between nodes 101 and 106, and it is thereby possible to increase the number of multilevels which can be latched.

Furthermore, an appropriate desired value may be employed as voltage $V_{DD}$, and it is of course the case that the inversion threshold values of inverters 117, 118, 119, and 120, and the threshold values of NMOS 109, 110, 111, and 112, may be set to freely selected values.

Figure 4:
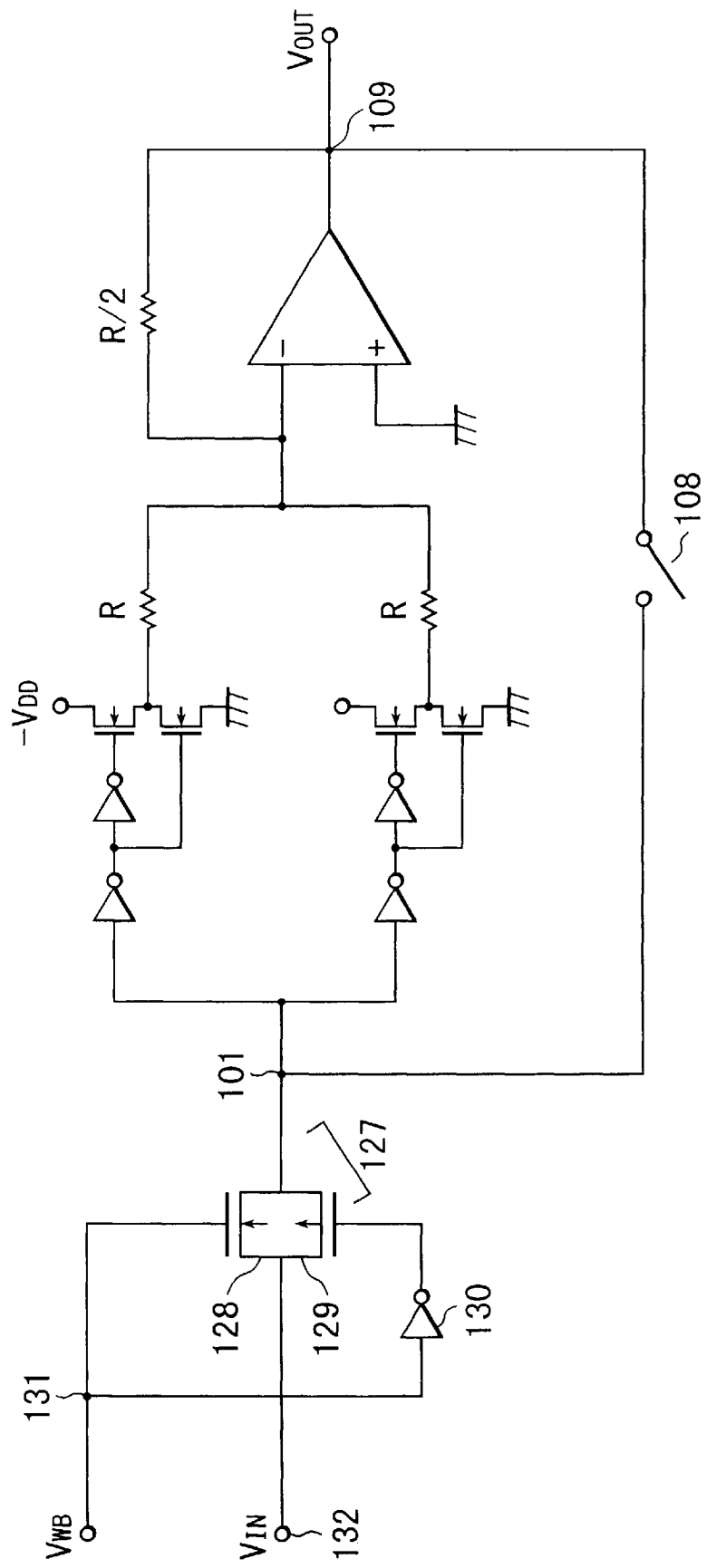
FIG. 4 is a circuit diagram showing a modified example of the circuit of embodiment 1.

FIG. 4 shows an example in which a switch is provided for controlling the input of the input signal into input node 101. In FIG. 4, the input signal control switch 127 is an CMOS switch comprising NMOS 128 and PMOS 129. This switch may comprise either one or the other of NMOS or PMOS as well. Reference 130 indicates an inverter, and node 131 is an input node which determines the ON/OFF state of the CMOS switch 127; in this case, for example, when the voltage of node 131 has a value of $V_{DD}$, the switch is placed in an ON state, while when the voltage has a value of 0, the switch is placed in an OFF state.

When CMOS switch 127 is placed in an ON state and an analog or multilevel input signal is inputted into node 132, the signal of 132 is inputted into node 101, and a multilevel voltage corresponding to this is outputted to node 107. Next, when switch 108 is placed in an ON state and a feedback loop has been established, and switch 127 is then placed in an OFF state, the voltage of node 107 is maintained in a static manner in node 101.

After switch 127 is placed in an OPT state, switch 108 may be placed in an ON state. Furthermore, a resistor may be employed in place of switch 108 of the operational amplifier. At this time, the ON resistance of switch 127 may be set so as to be sufficiently smaller than that of the resistor employed in place of switch 108.

(Embodiment 2)

Figure 5:
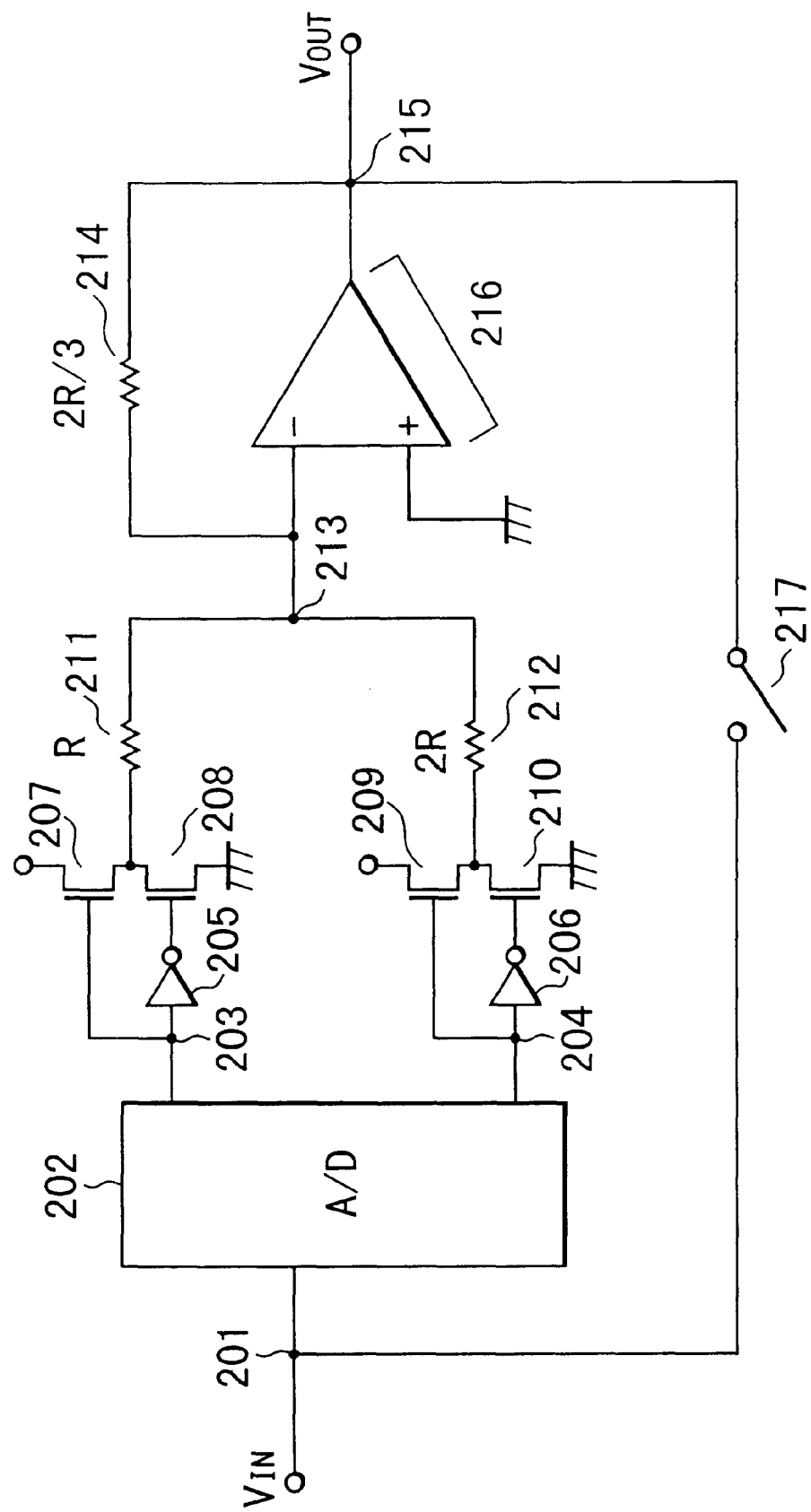
FIG. 5 is a circuit diagram showing a second embodiment of the present invention.

In the present embodiment, the analog or multilevel signal inputted into node 101 is converted into a weighted binary signal group, and this is then again converted into multilevels. The circuitry of the present embodiment is shown in FIG. 5.

The signal inputted into node 201 is converted into a weighted two bit signal by A/D converter 202, and is outputted to nodes 203 and 204.

If the voltages of nodes 203 and 204 are represented by V(203) and V(204), then the design it such that, for example, when $V_{IN}$ is within a range of $0-V_{DD}/6$, V(203)=0, and V(204) =0; when $V_{IN}$ is within a range of $V_{DD}/6-V_{DD}/2$, V(203)=0, and V(204)=$V_{DD}$; when $V_{IN}$ is within a range of $V_{DD}/2-5V_{DD}/6$, then V(203)=$V_{DD}$, and V(204)=0; and when $V_{IN}$ is within a range of $5V_{DD}/6-V_{DD}$, then V(203)= $V_{DD}$, and V(204)=$V_{DD}$.

When V(203)=V(204)=0, then a current does not flow to resistors 211, 212, and 214, and the voltage of node 215 is 0; when V(203)=0 and V(204)=$V_{DD}$, then a current of $V_{DD}/2R$ flows to resistors 212 and 214, and the voltage of node 215 is $(V_{DD}/2R)\times(2R/3)=V_{DD}/3$; when V(203)=$V_{DD}$, and V(204)=0, then a current of $V_{DD}/R$ flows to resistors 211 and 214, and the voltage of node 215 is $(V_{DD}/R)\times(2R/3)=2V_{DD}/3$; and when V(203)=V(204)=$V_{DD}$, then a current of $V_{DD}/R$ flaws to resistor 211, a current of $V_{DD}/2R$ flows to resistor 212, and a current of $V_{DD}/R+V_{DD}/2R$ flows to resistor 214, and the voltage of node 215 becomes $(V_{DD}/R+V_{DD}/2R)\times(2R/3)=V_{DD}$.

Figure 6:
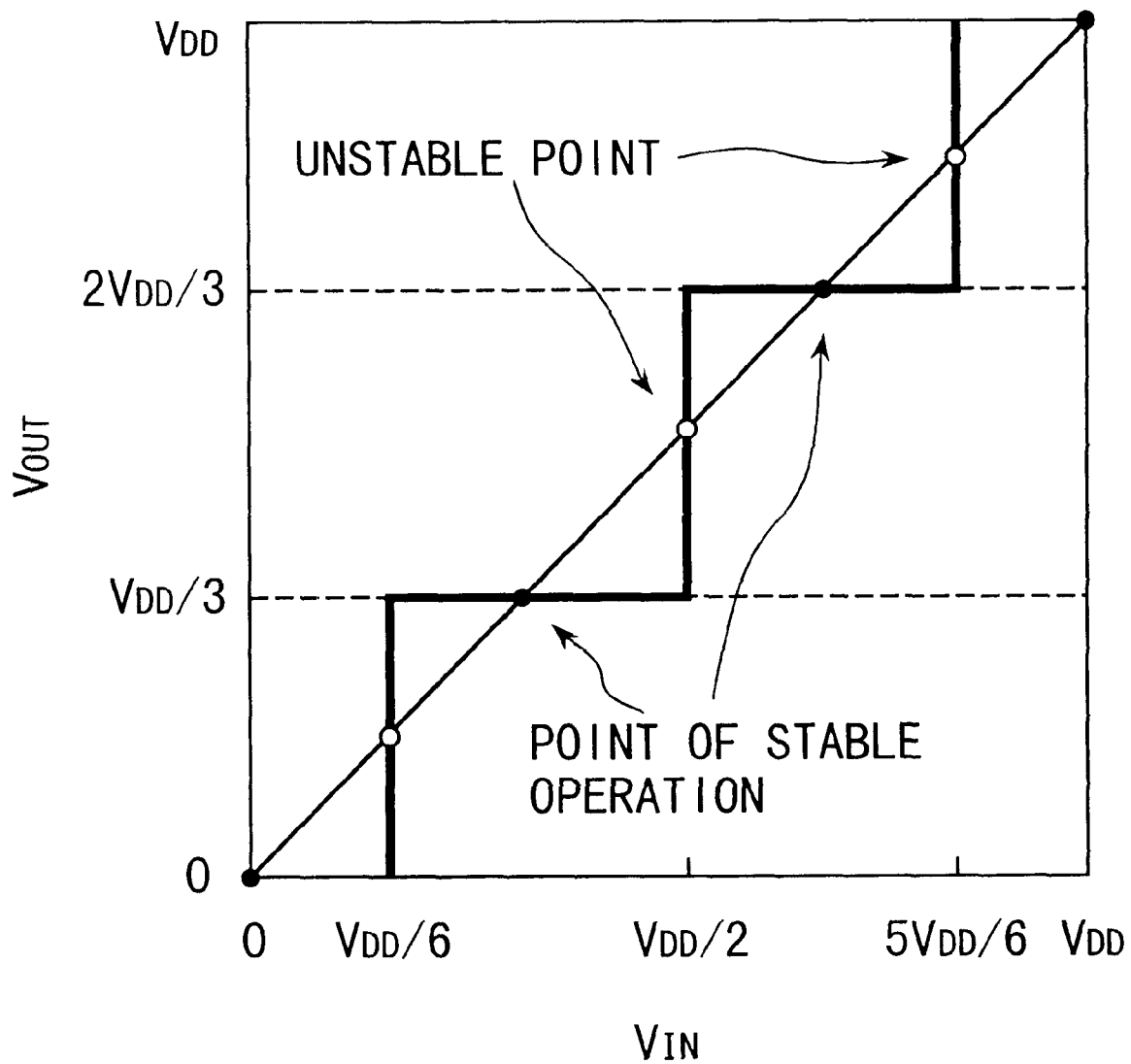
FIG. 6 is a graph showing the relationship between the input and the output of the circuit of FIG. 5.

In FIG. 6, the relationship between $V_{IN}$ and $V_{OUT}$ is shown. Now, by means of placing switch 217 in an ON state and applying feedback, in this case four stable states can be realized in which $V_{IN}=V_{OUT}=0$, $V_{DD}/3$, $2V_{DD}/3$, and $V_{DD}$.

In this case, the output of the A/D converter was two bits; however, the appropriate and necessary number of bits may be employed. Furthermore, the number of resistors 211 and 212 may also be increased in accordance with the number of output bits of the A/D converter. Furthermore, it is of course the case that resistor 214 may be included and the resistance values thereof may be appropriately altered.

(Embodiment 3)

Figure 7:
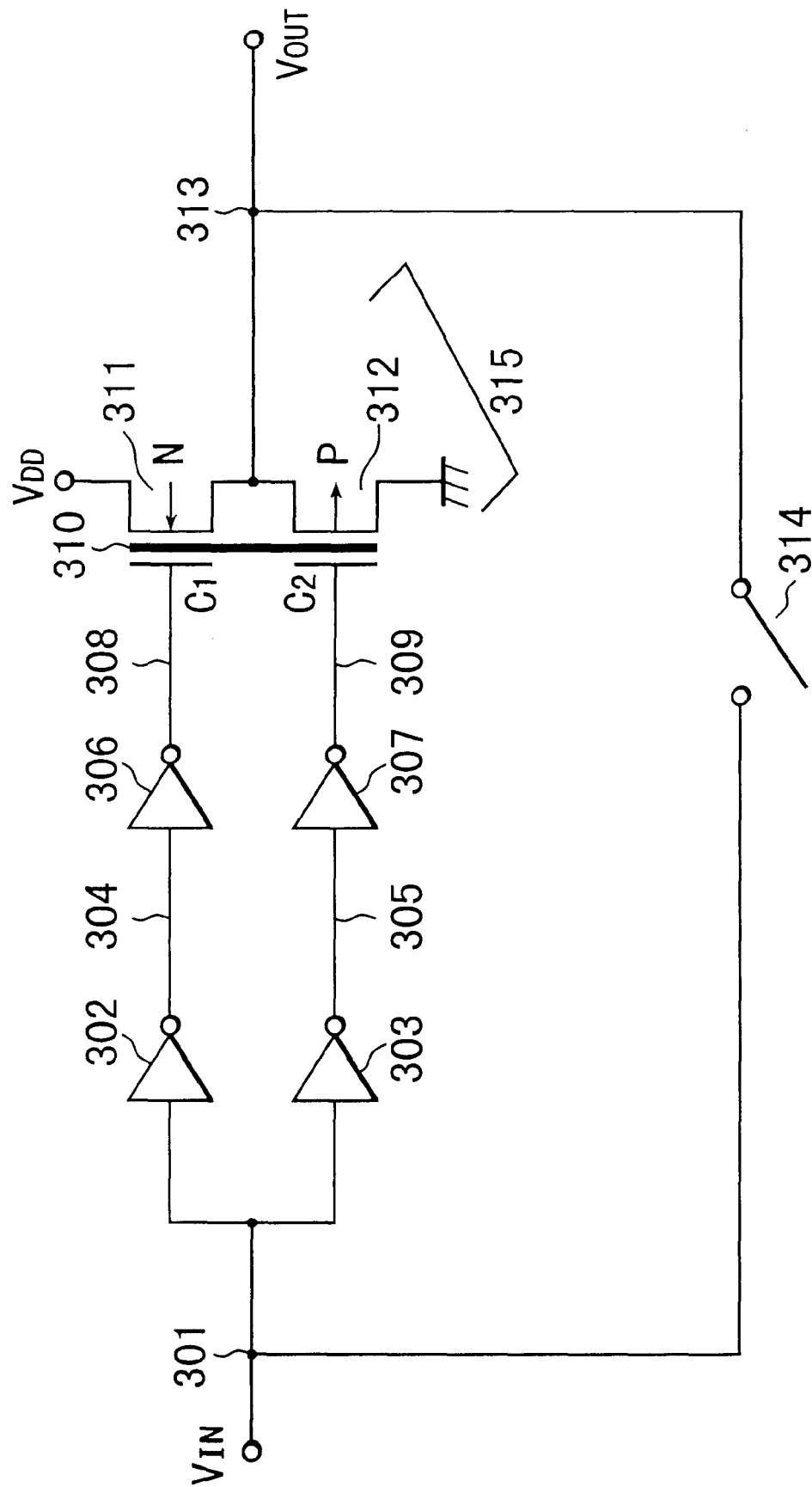
FIG. 7 is a circuit diagram showing a third embodiment of the present invention.
Figure 8:
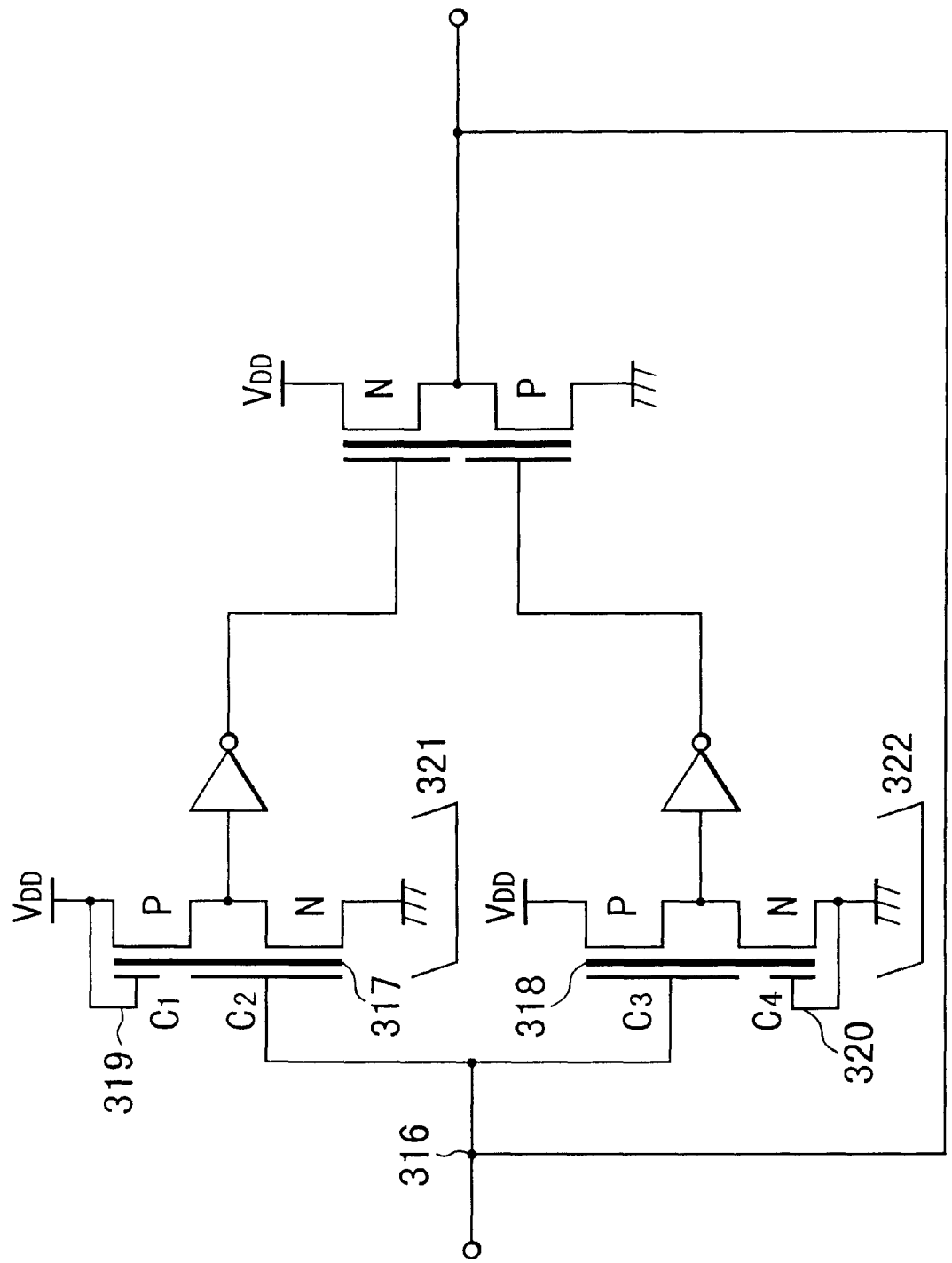
FIG. 8 is a circuit diagram showing a modified example of the circuit of embodiment 3.

A third embodiment of the present invention is shown in FIGS. 7 and 8.

A circuit having the same functions as the circuit of FIG. 1 which is realized using neuron MOS transistors is depicted in FIGS. 7 and 8. By means of employing neuron MOS transistors in this manner the number of elements can be greatly reduced.

In FIG. 7, reference 311 indicates a N channel neuron MOS transistor, while reference 312 indicates a P channel neuron MOS transistor. The neuron MOS transistor is a transistor operating in a manner similar to that of the neuron, which is the nerve cell comprising the human brains this is a MOS type transistor of a completely now conception which was invented in order to realize neuron computers. (inventors: Tadashi Shibata, Tadahiro Ohmi, Japanese Patent Application, First Publication, No. Hei 3-6679). Hereinbelow, this transistor will be referred to in shortened form as νMOS.

Such a νMOS is a transistor having early powerful functions; in the present invention, because this νMOS is employed as a fundamental element, the elements can be greatly simplified. The structure and function of the νMOS will be explained using the separately attached FIG. 15.

The sources of the N channel νMOS 311 (shortened to N-νMOS) and the P channel νMOS 312 (shortened to P-νMOS) are connected to one another, and form a source follower circuit having an CMOS structure employing neuron MOS. This is termed a complementary νMOS source follower (shortened to C-νMOS source follower). Reference 310 indicates a floating gate, which forms a can gate of νMOS 311 and 312, respectively.

The C-νMOS source follower circuit is a circuit in which, if the potential of the floating gate 310 increases, the potential of the node 313 follows this and also increases, while when the potential of floating gate 310 decreases, the potential of node 313 also decreases. References 308 and 309 indicate inputs which are capacitively coupled with the floating gate 310, respectively, and $C_1$ and $C_2$ represent capacitive coupling coefficients between, respectively, inputs 308 and 309 and the floating gate 310. References 302, 303, 306, and 307 indicate standard inverter circuits, while reference 314 indicates a switch.

In order to explain the operation of the circuit of FIG. 7, the structure and basic operating principle of the νMOS must firs be explained. FIG. 15(a) shows an example of the cross-sectional structure of a 4-input N channel νMOS transistor (N -νMOS); reference 401 indicates, for example, a P type silicon substrate, references 402 and 403 indicate a source and drain formed from N diffusion layers, reference 404 indicates a gate insulating film (for example, a $SiO_2$ film) provided on a channel region 405 between the source and the drain, reference 406 indicates a floating electrode which is electrically insulated and is in a potentially floating state, reference 407 indicates an insulating film such as, for example, $SiO_2$ or the like, and references 408a, 408b, 408c, and 408d indicate electrodes which serve as input gates. FIG. 15(b) shows a further simplification of this in order to analyze the operation of the νMOS. If the capacitive coupling coefficients between the input gate electrodes and the floating gate are represented by $C_1$, $C_2$, $C_3$, and $C_4$ as shown in the Figure, and the capacitive coupling coefficient between the floating gate and the silicon substrate is represented by $C_0$, then the potential $\Phi_F$ of the floating gate is given by the following formula.

$$\Phi_F = (1/C_{TOT})(C_1V_1 + C_2V_2 + C_3V_3 + C_4V_4)$$

Here, $C_{TOT} = C_0 + C_1 + C_2 + C_3 + C_4$ $V_1$, $V_2$, $V_3$, and $V_4$ indicate voltages which are applied to, respectively, input gates 408a, 408b, 408c, and 408d, and the potential of the silicon substrate is 0V; that is to say, it is grounded.

Now, the potential of source 402 will be assumed to be 0V. That is to say, the potential of all electrodes are set to values measured using the source as a standard. When this is done, the νMOS shown in FIG. 15 becomes identical to a standard N channel MOS transistor if the floating gate 406 is viewed as a standard gate electrode; when the gate potential $\Phi_F$ thereof exceeds a threshold value ($V_{TH}^*$), then an electron channel (N channel) is formed in the region 405 between the source 402 and the drain 403, and the source and drain become electrically connected. That is to say, the νMOS enters an ON state when the following conditions are fulfilled:

$$(1/C_{TOT})(C_1V_1 + C_2V_2 + C_3V_3 + C_4V_4) > V_{TH}^*$$

The foregoing explanation related to an N channel νMOS transistor; however, devices also exist in which, in FIG. 15(a), source 402, drain 403, and substrate 401 are all made the opposite conductivity type. That is to say, in such a νMOS the substrate is a N type substrate, while the source and drain are formed from P+diffusion layers, and this is termed a P channel MOS transistor (P-νMOS).

Next, the operation of the C-νMOS source follower 315 shown in FIG. 7 will be explained.

The threshold values of the νMOS transistors 311 and 312 as seen from the floating gate are represented bye respectively, $V_{TN}$ and $V_{TP}$.

If the potential of the floating gate 310 is represented by $\Phi_{FA}$, and the potentials of nodes 308 and 309 are represented by, respectively, V(308) and V(309), then the following results:

$$\Phi_{FA} = \frac{C_1V(308) + C_2V(309)}{C_{TOT}}$$

Now, in order to simplify the explanation, it will be assumed that the capacity $C_0$ bets the floating gate and substrate fulfills the condition that $C_0 << C_1 + C_2$, and that $C_0$ can be ignored. That is to say, it is assumed that $C_{TOT} = C_1 + C_2$. It is of course the case that the explanation will be identical even if $C_0$ has a value on the level of $C_1 + C_2$.

In the circuit shown in FIG. 7, setting is conducted such that, for example, $C_1:C_2=1:1$, and the threshold values of the N-νMOS and P-νMOS as seen from the floating gate are, respectively, −1V and +1V. It is of course the case that these values may be modified to other values where necessary.

Node 313 serves as the source for both the N-νMOS and P-νMOS, and if the N-νMOS and P-νMOS are both operating in the saturation region, then the current flowing through the N-νMOS and P-νMOS is, respectively, $k\{V(310)-V(313)-V_{TN}\}^2$, and $k\{V(310)-V(313)-V_{TP}\}^2$. (k: constant, $V_{TN}$: threshold value of the N-νMOS as seen from the floating gate, $V_{TP}$: threshold value of the P-νMOS as seen from floating gate).

Furthermore, the current flowing through the N-νMOS and P-νMOS is equivalent, so that $k\{V(310)-V(313)-V_{TN}\}2 = k\{V(310)(313)-V_{TP}\}2$, and $V_{TN} = V_{TP}$, so that V(310)=V(313) results.

That is to say, this circuit is a voltage follower circuit in which the source potential changes in such a manner as to follow the gate potential. $\Phi_{FA} = V(308)/2 + V(309)/2$, so that this voltage is outputted to node 313.

If the threshold value of inverters 302 and 303 is set to, for example, $V_{DD}/4$ and $3V_{DD}/4$, then the relationship between $V_{IN}$ and $V_{OUT}$ is identical to that shown in FIG. 2(a), and by means of placing switch 314 in an ON state and feeding back $V_{OUT}$ to $V_{IN}$, points of stability having three different values are generated.

The circuitry of FIG. 8 represents an example in which, in the circuitry of FIG. 7, inverters 302 and 303 are replaced by, respectively, νCMOS inverters 321 and 322. The node 319 which is connected to the power source is coupled with floating gate 317 via capacity $C_1$. Furthermore, the node 320, which is connected to the ground, is coupled with floating gate 318 via capacity $C_4$. Here, nodes 319 and 320 need not necessarily have potentials of only $V_{DD}$ or ground; they may be connected to freely selected power sources.

If the threshold values of ν-CMOS inverter 321 and 322 as seen from the floating gates are set to, for example, $V_{DD}/2$, and setting is conducted such that $C_1/C_2=½$, and $C_4/C_3=½$, then the apparent threshold values of ν-CMOS inverters 321 and 322, as seen from node 316, become, respectively, $V_{DD}/4$ and $3V_{DD}/4$.

By means of employing ν-CMOS inverters in this manner and connecting one of the input terminals thereof to a predetermined power source, it is possible to obtain a freely selected threshold value.

Figure 9:
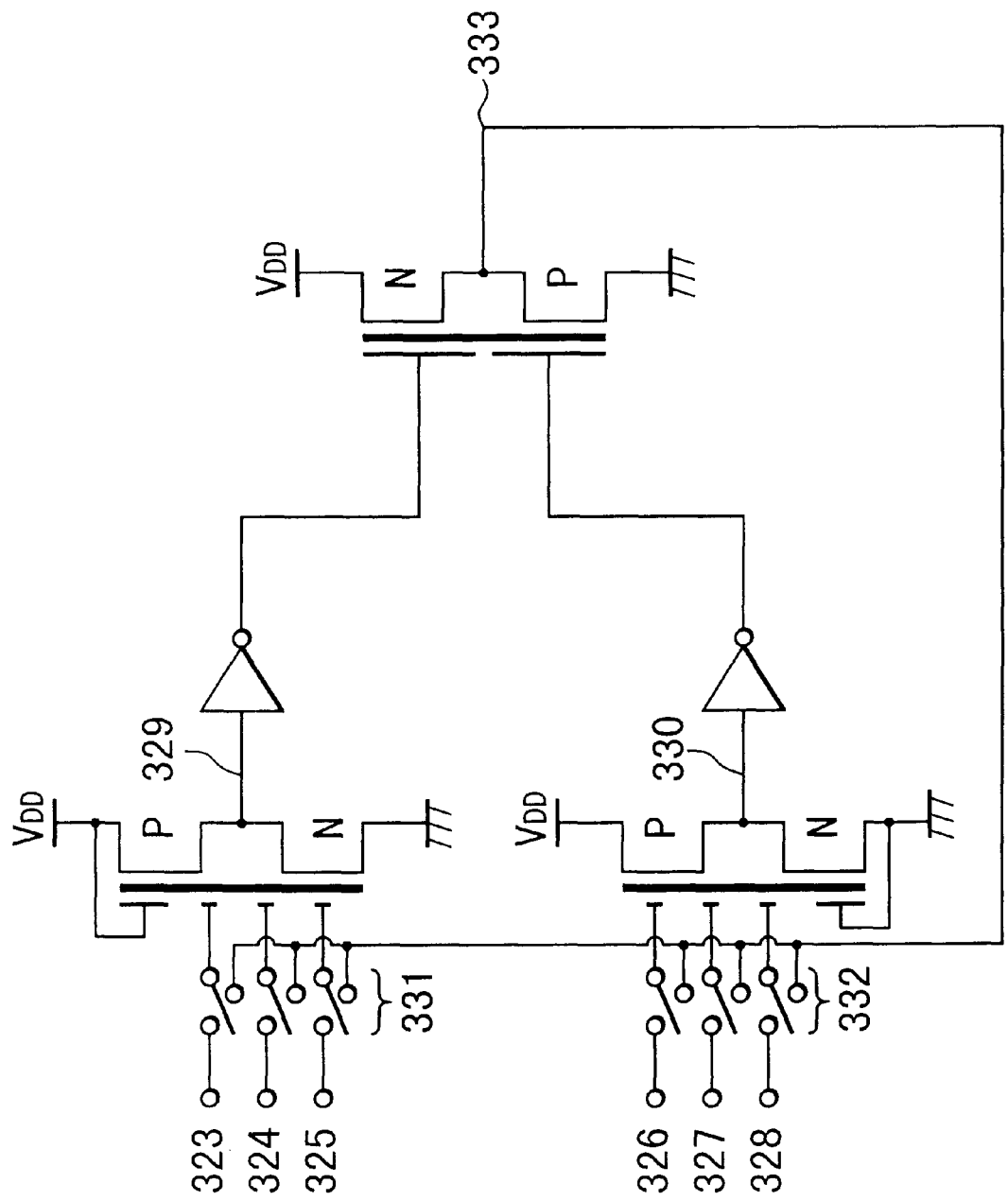
FIG. 9 is a circuit diagram showing a modified example of the circuit of embodiment 3.

Heretofore, examples have been shown in which the input signal was inputted by 1 signal line; however, the input signals may be inputted using a plurality of signal lines. In FIG. 9, an example is depicted in which a plurality of signal lines are inputted. Here, the input node 316 of FIG. 8 has been divided into a plurality of signal lines. A freely selected signal is inputted into each input.

Switch groups 331 and 332 are connected to the initial input signals 323–328, and the outputs 329 and 330 of the inverters are determined by means of the average value of the input signals 323–325 and 326–328, and the output 333 is determined in accordance with this.

Next, when switch groups 331 and 332 are connected to the output 333 side, the state of the outputs 329, 330, and 333 at that time is latched.

(Embodiment 4)

Figure 10:
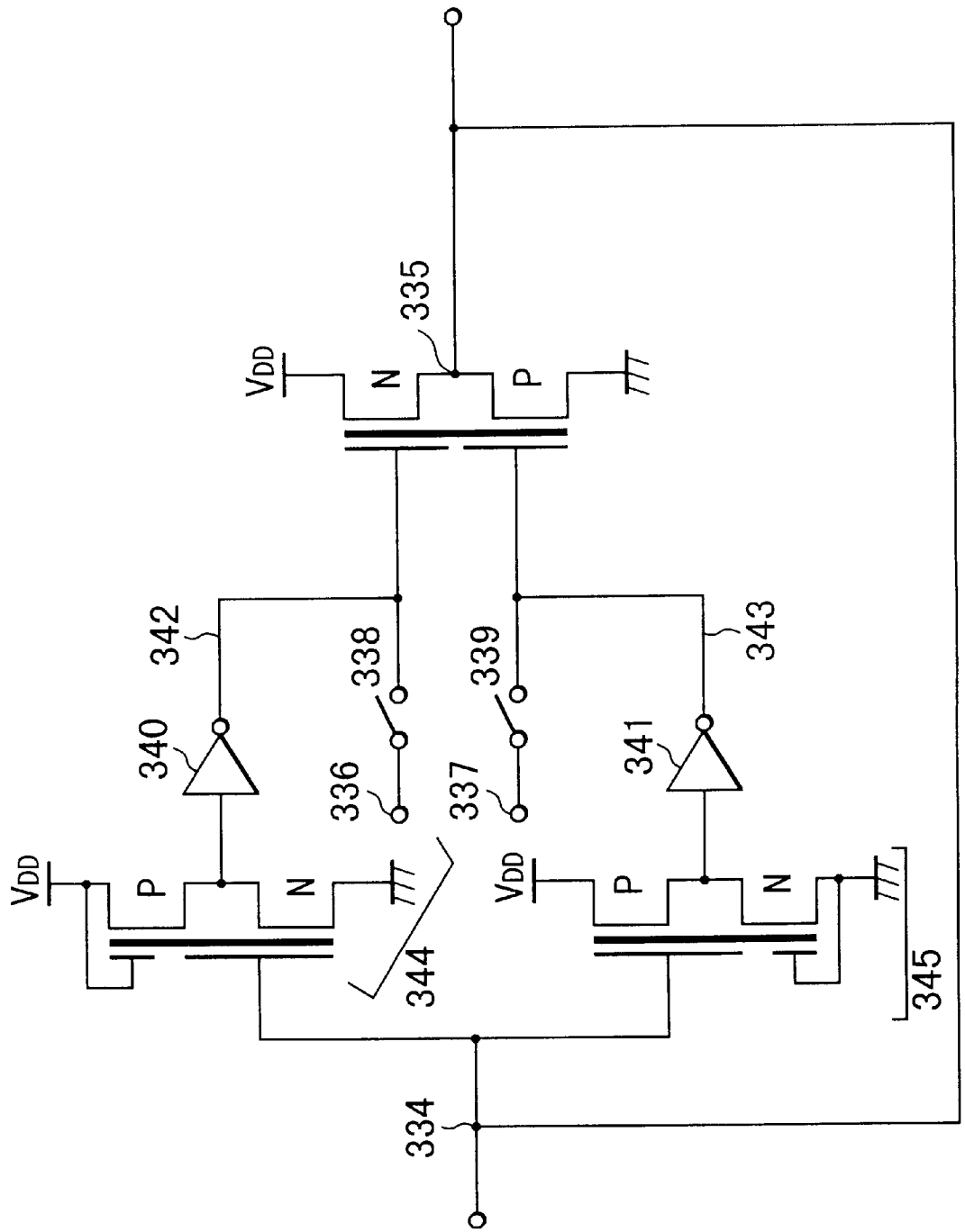
FIG. 10 is a circuit diagram showing a fourth embodiment of the present invention.

A fourth embodiment of the present invention is shown in FIG. 10.

FIG. 10 shows an example in which an input terminal is provided in the second circuit as well. The input signals are inputted from nodes 336 and 337 via, respectively, switches 338 and 339, and voltages corresponding to this are outputted to node 335. For example, if $V_{DD}$ is inputted into node 336 and 0 is inputted into 337, then $V_{DD}/2$ is outputted to node 335. At this time, if the threshold values of inverters 344 and 345 as seen from node 334 are set, respectively, to $V_{DD}/4$ and $3V_{DD}/4$, then $V_{DD}$ and 0, respectively, are outputted to nodes 342 and 343. Accordingly, even if switches 338 and 339 are subsequently placed in an OFF state and the input is electrically cut off from the circuit, the state thereof is stably latched.

(Embodiment 5)

Figure 11:
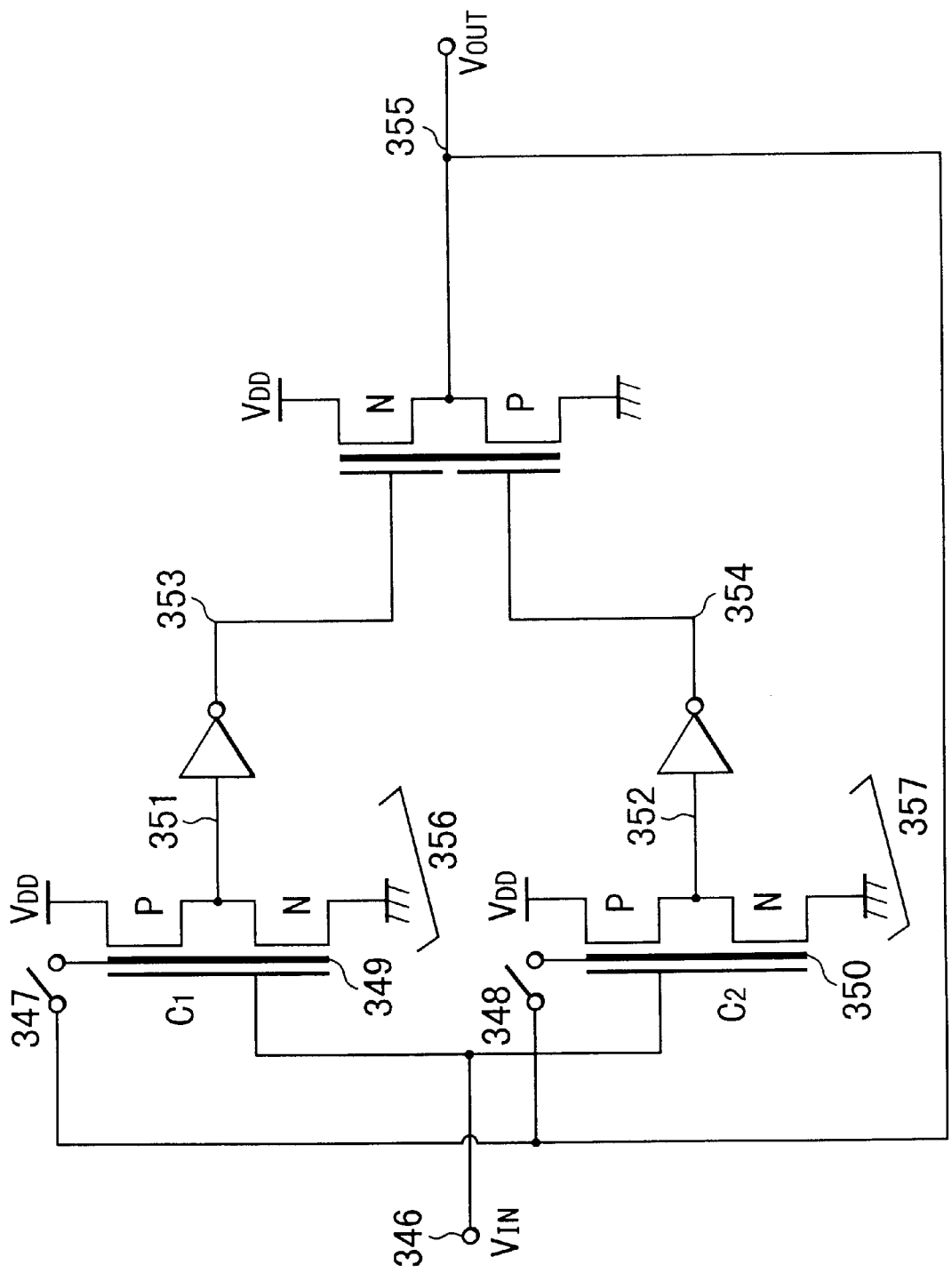
FIG. 11 is a circuit diagram showing a fifth embodiment of the present invention.

In FIG. 11, an example is depicted as a fifth embodiment of the present invention, in which the input terminal and the terminal to which feedback is applied are divided. In the example of FIG. 11, the input terminal and the terminal to which feedback is applied are completely separate. The input voltage is transmitted from node 346 to floating gates 349 and 350 via capacitive coupling. In the initial state, for example, the voltage of nodes 346, 349, and 350 is set to 0, and switches 347 and 348 are in an OFF state.

If node 346 is capacitively coupled with floating gates 349 and 350 under conditions such that $C_1/C_{TOT}=1$ and $C_2/C_{TOT}=1$, then the potential of node 346 appears in an unchanged manner in floating gates 349 and 350.

Figure 2:
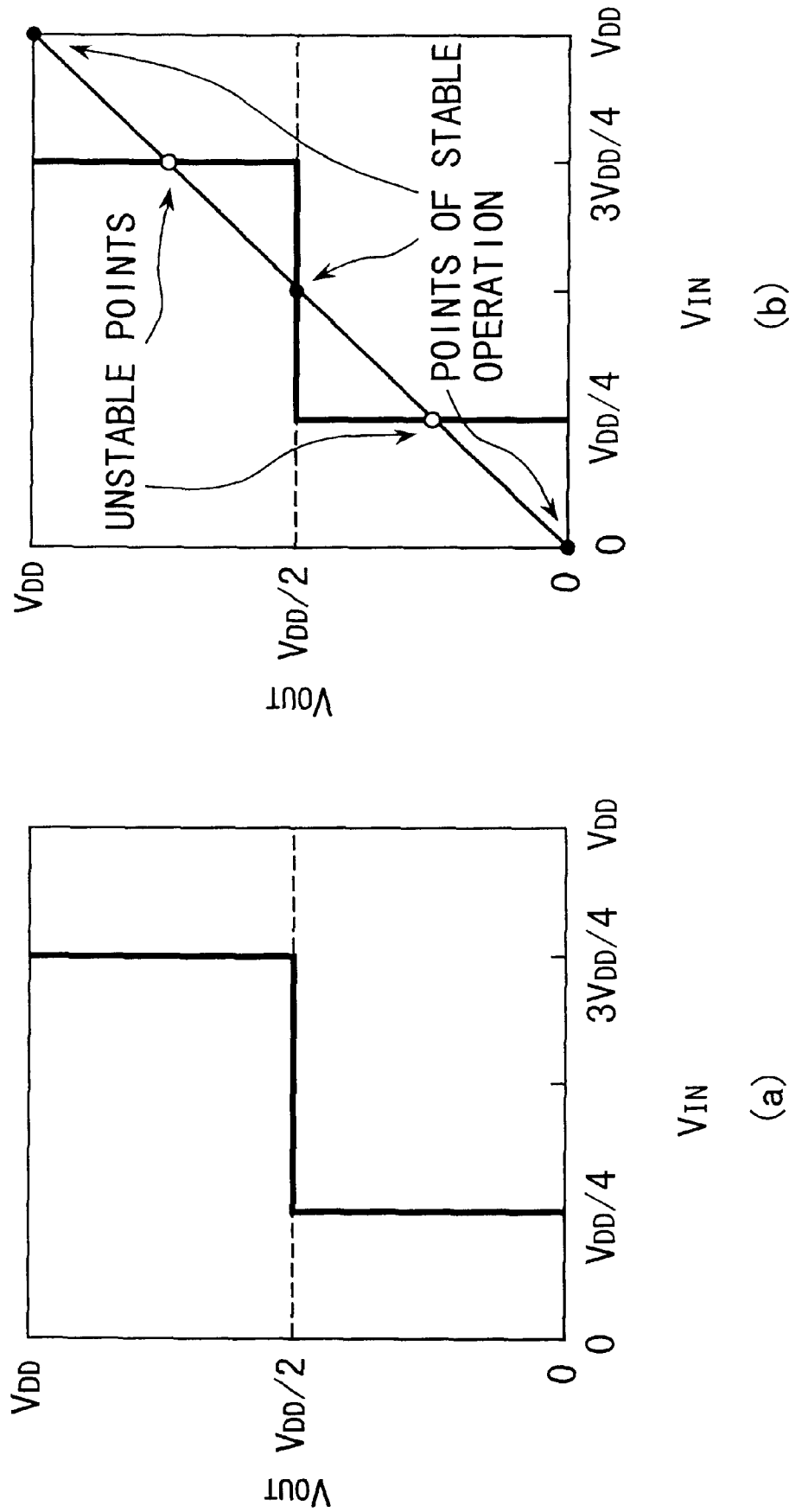
FIG. 2 is a graph showing the relationship between the input and the output of the first circuit.

If the threshold values of inverters 356 and 357 as seen from the floating gates 349 and 350 are set to, for example, $V_{DD}/4$, and $3V_{DD}/4$, then the relationship between $V_{IN}$ and $V_{OUT}$ is the same as that shown in FIG. 2(*a*), and by means of feeding back output $V_{OUT}$ to floating gates 349 and 350 via switches 347 and 348, it is possible to maintain multilevel values in a manner identical to that shown in FIG. 2(*b*). In this case, once the maintenance state has been entered, even it the voltage inputted into node 346 subsequently changes, the values which are maintained will not change. Here, it is of course the case that input node 346 may have a plurality of inputs, as shown in FIG. 9.

(Embodiment 6)

Figure 12:
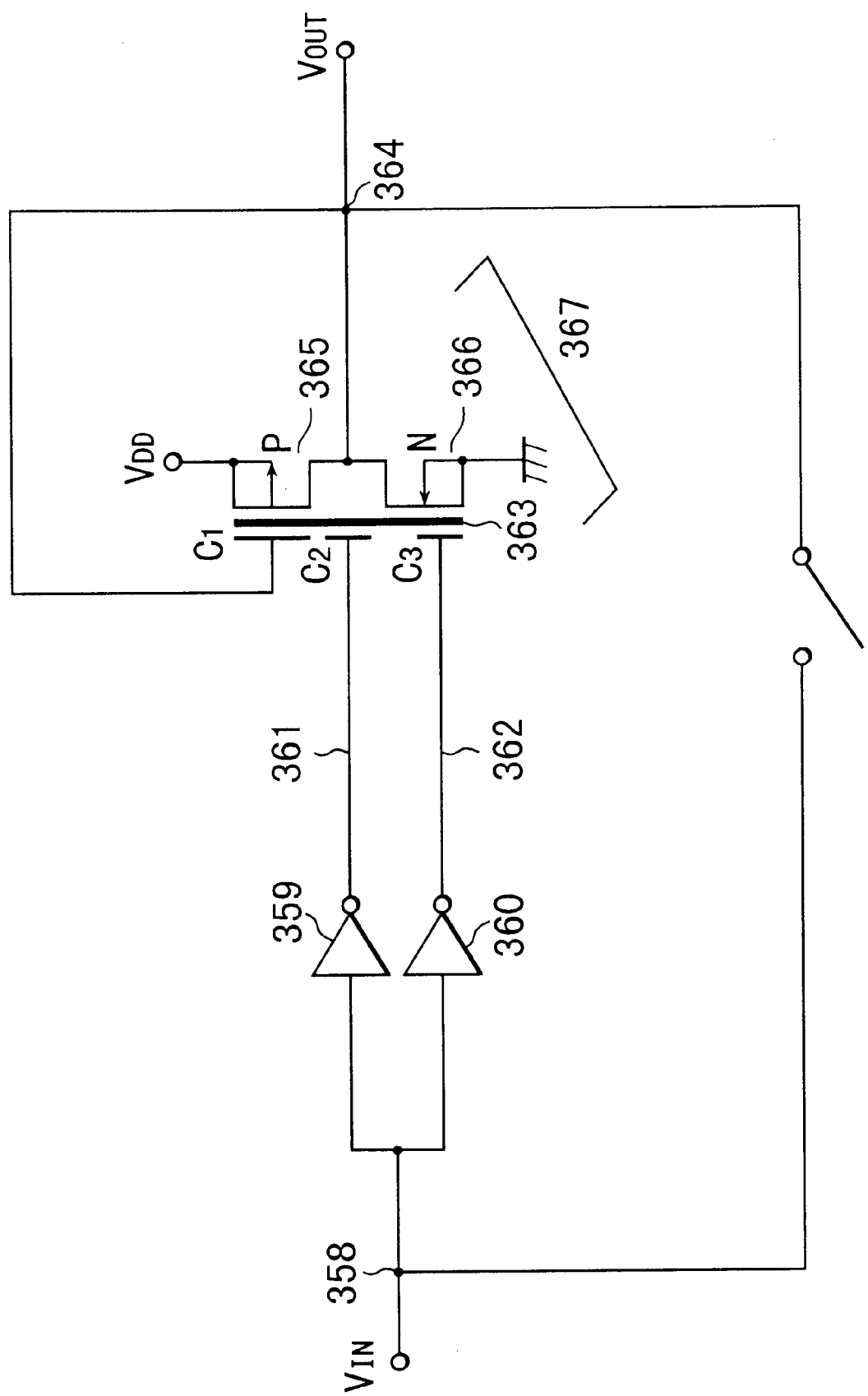
FIG. 12 is a circuit diagram showing a sixth embodiment of the present invention.

A sixth embodiment of the present invention is shown in FIG. 12.

The circuit of FIG. 12 has functions identical to those of the circuit of FIG. 7. The inverters 306 and 307 and the CMOS source follower 315 of FIG. 7 are replaced by an analog inverter 367 in FIG. 12. In order to explain the operation of this circuit, first it is necessary to explain the operation of the analog inverter.

Figure 13:
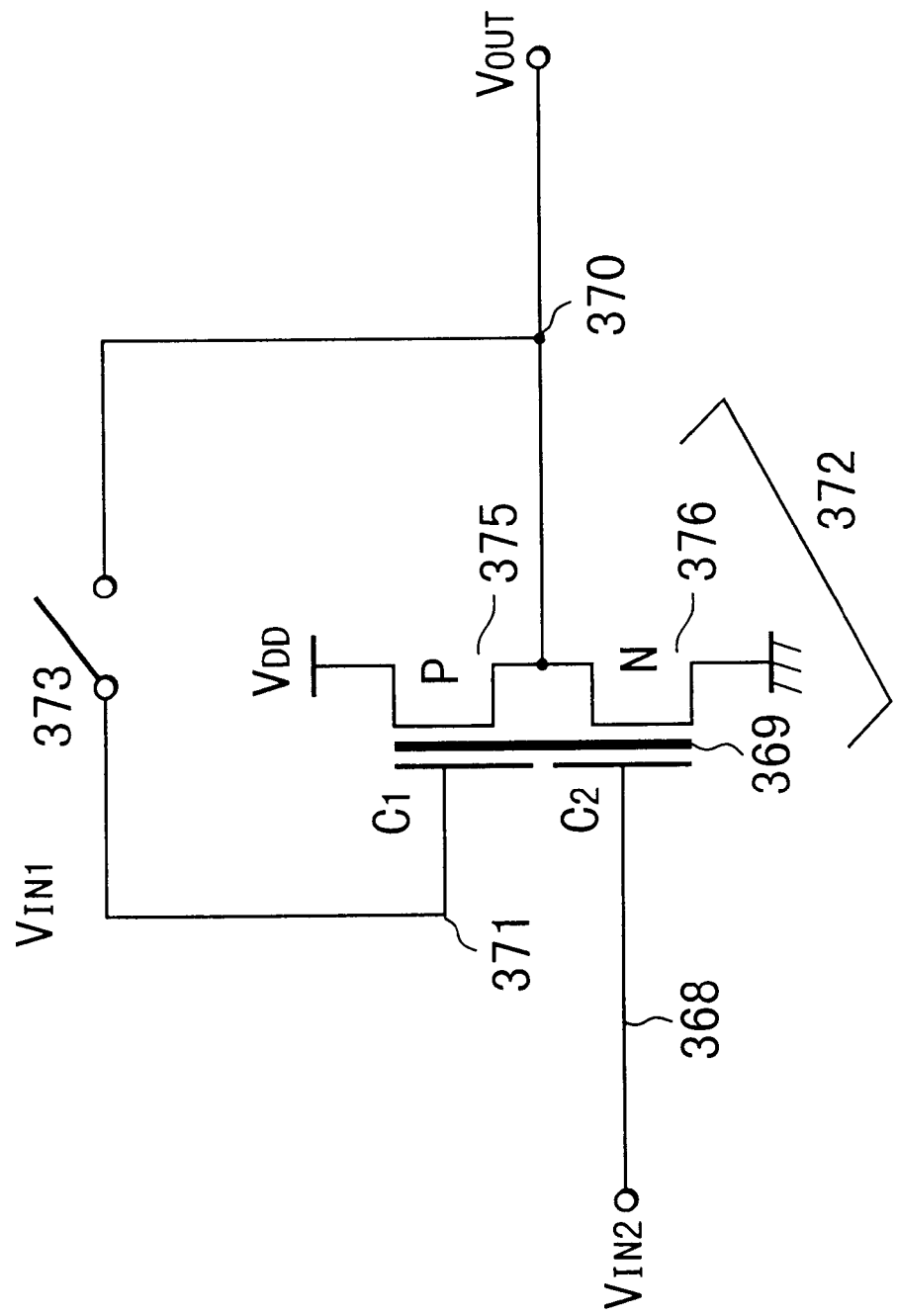
FIG. 13 is a circuit diagram showing an analog inverter.

FIG. 13 shows an analog inverter having 1 input terminal. Here, node 368 is a terminal which serves to change the apparent threshold value of v-CMOS inverter 372 as seen from terminal 371. Terminals 371 and 368 are connected to the floating gate 369 via capacities $C_1$ and $C_2$, and setting is conducted so that, for example, $C_1=C_2$.

Figure 14:
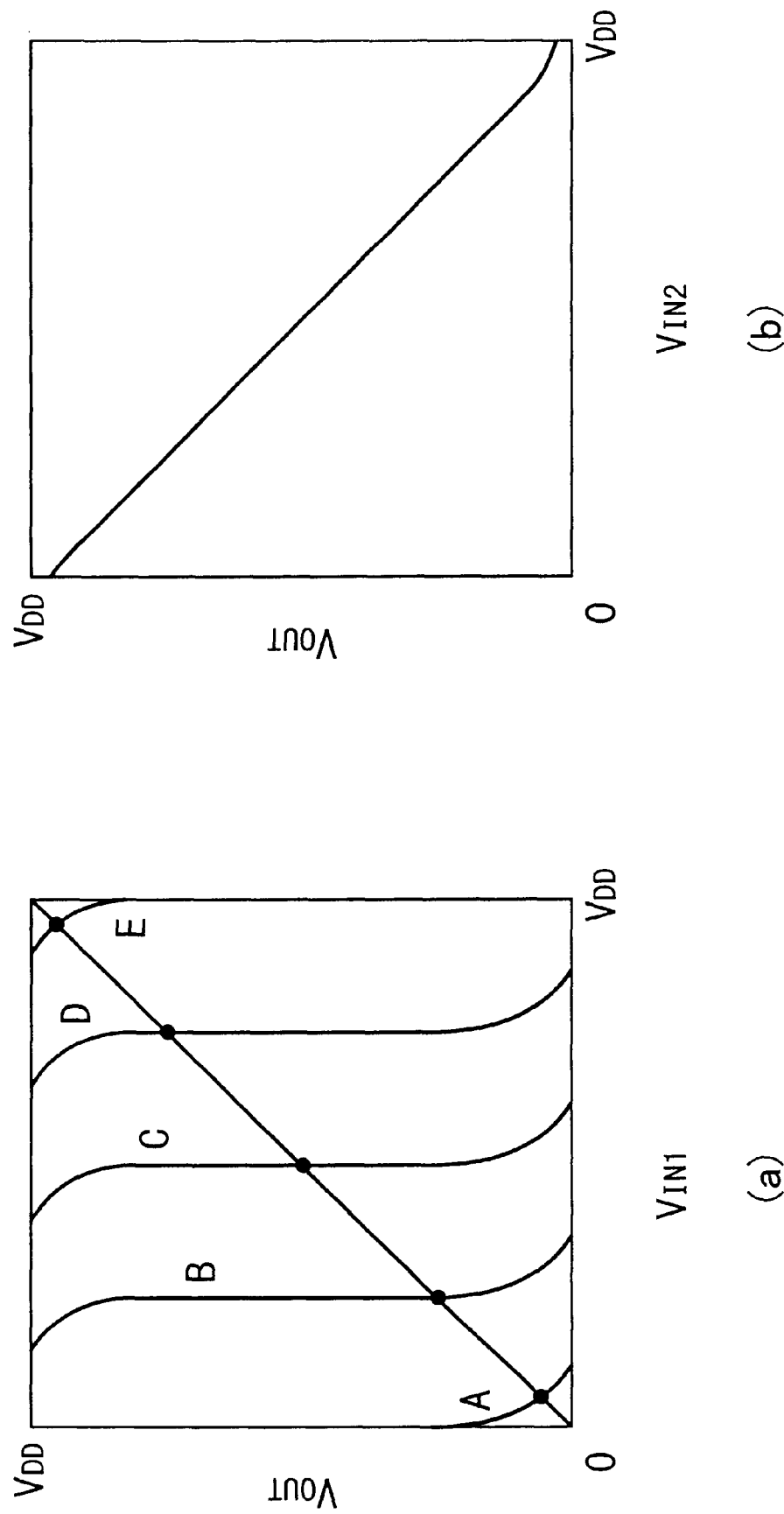
FIG. 14 is a graph showing the relationship between the input and the output of the circuit of FIG. 13.

When switch 373 is in an OFF state, if the voltage $V_{IN2}$ of terminal 368 is 0, then the threshold value as seen from terminal 371 becomes $V_{DD}$, and if the voltage of terminal 368 is $V_{DD}$, then the threshold value as seen from terminal 371 becomes 0. The relationship between $V_{IN1}$ and $V_{OUT}$ when $V_{IN2}$ is changed is shown in FIG. 14(*a*). In the Figure, the A, B, C, D, and E characteristics are such that, respectively, $V_{IN2}=V_{DD}$, $3V_{DD}/4$, $V_{DD}/2$, $V_{DD}/4$, and 0.

Here, when switch 373 is placed in an ON state, $V_{IN1}=V_{OUT}$ is simultaneously fulfilled, so that the operational points of the circuit at the various voltages $V_{IN2}$ becomes the points of intersection between the characteristics of the inverter and $V_{IN}=V_{OUT}$, as show in FIG. 14(*a*). When $V_{IN2}=0$, $V_{OUT}=V_{DD}$; when $V_{IN2}=V_{DD}/4$, $V_{OUT}=3V_{DD}/4$; when $V_{IN2}=V_{DD}/2$, $V_{OUT}=V_{DD}/2$; when $V_{IN2}=3V_{DD}/4$, $V_{OUT}=V_{DD}/4$; and when $V_{IN2}=V_{DD}$, $V_{OUT}=0$. That is to say $V_{OUT}$ is equivalent to $V_{DD}-V_{IN2}$.

The relationship between $V_{IN2}$ and $V_{OUT}$ when this type of switch 373 is placed in an ON state is shown in FIG. 14(*b*). If the threshold values of the PMOS 375 and the NMOS 376 comprising the v-CMOS inverter 372 are set to, respectively, $-V_{DD}/2$, and $V_{DD}/2$, then $V_{OUT}$ will more accurately conform to $V_{DD}-V_{IN2}$; however, these threshold values may be altered where necessary. Furthermore, it is of course the case that the ratio of $C_1$ and $C_2$ may be altered where necessary.

Here, setting is conducted so that, in FIG. 12, the threshold values of inverters 359 and 360 are, for example, $V_{DD}/4$ and $3V_{DD}/4$, respectively, and $C_1$: $C_2$: $C_3=2$: 1: 1. At this time, a voltage equivalent to $V_{DD}$ minus the average of the voltages of terminals 361 and 362 is outputted as $V_{OUT}$, so that when $V_{IN}$ is within a range of $0-V_{DD}/4$, the voltages of terminals 361 and 362 are both $V_{DD}$, and $V_{OUT}=V_{DD}-(V_{DD}+V_{DD})2=0$, when $V_{IN}$ is within a range of $V_{DD}/4-3V_{DD}/4$, the voltages of terminals 361 and 362 are 0 and $V_{DD}$, respectively, so that $V_{OUT}=V_{DD}-(0+V_{DD})/2=V_{DD}/2$, and when $V_{IN}$ is within a range of $3V_{DD}/4-V_{DD}$, the voltages of terminals 361 and 362 are both 0, and $V_{OUT}=V_{DD}-(0+0)/2=V_{DD}$. Accordingly, in this circuit, as well, the relationship between $V_{IN}$ and $V_{OUT}$ is that shown in FIG. 2(*a*), and by means of feeding back $V_{OUT}$ to $V_{IN}$, stable states having three differing values can be produced.

(Embodiment 7)

Figure 16:
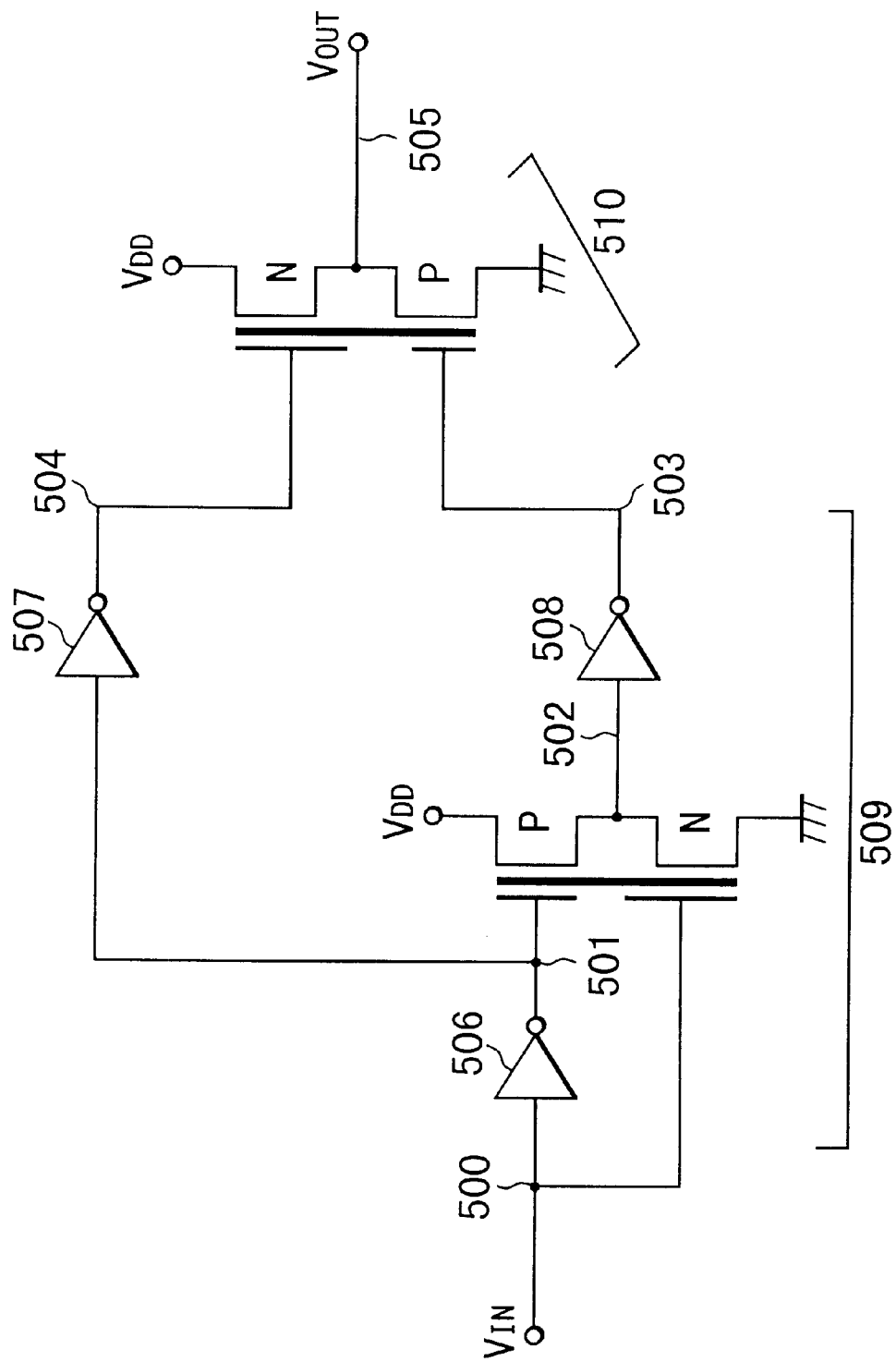
FIG. 16 is a circuit diagram showing a seventh embodiment of the present invention.

A seventh embodiment of the present invention is shown in FIG. 16. In this example, a two bit A/D converter constructed using neuron MOS transistors is employed. The portion marked 509 is the two bit A/D converter, while the portion marked 510 is a C-vMOS source follower circuit which serves to convert a two bit signal into a multilevel signal.

Figure 17:
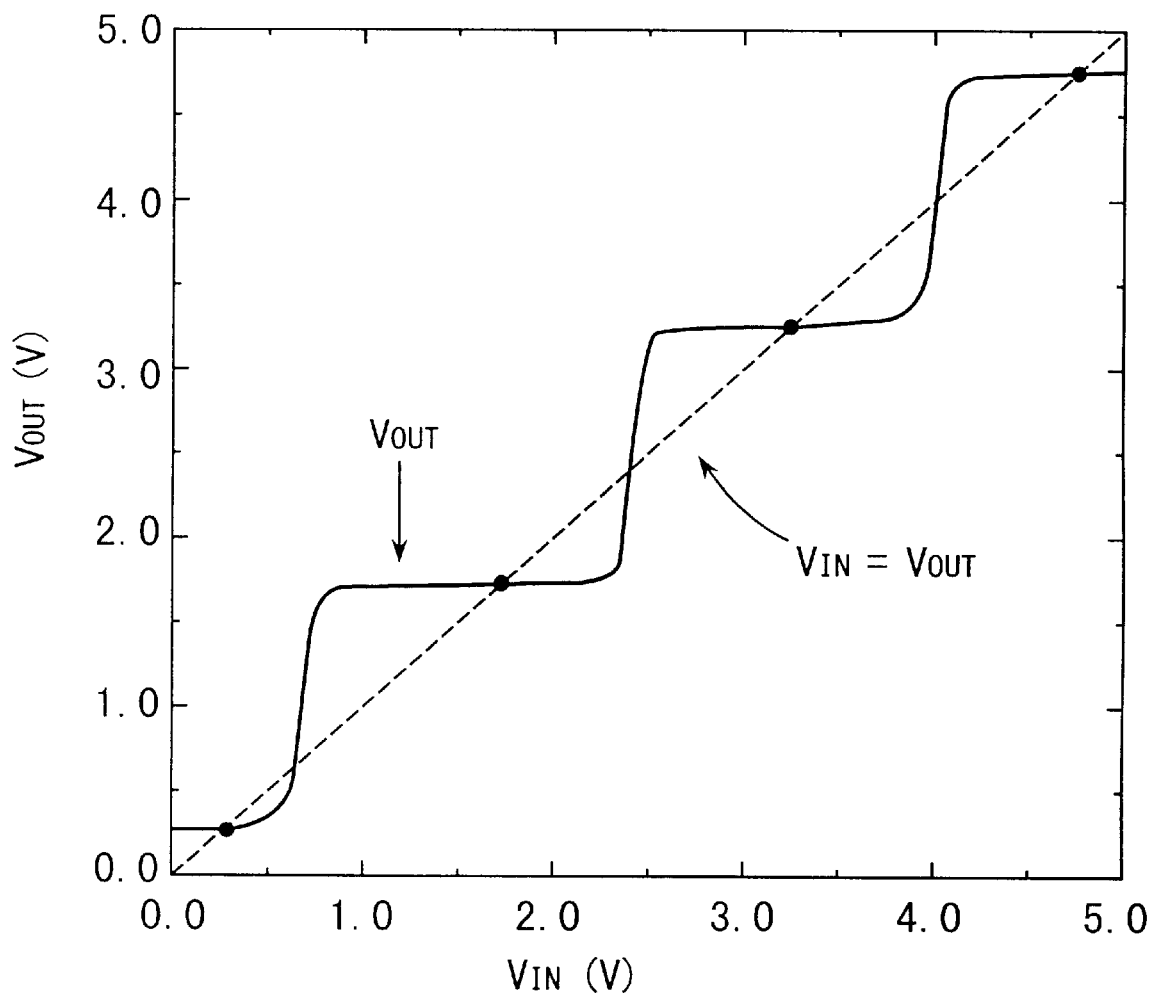
FIG. 17 is a graph showing the relationship between the input and output of the circuit of FIG. 16.

The results of the calculation of a circuit simulation of the relationship been $V_{IN}$; and $V_{OUT}$ are shown in FIG. 17. A clean step form characteristic was obtained; it can be seen that the memory is one having stable states having 4 values when Van and $V_{OUT}$ are connected.

Figure 18:
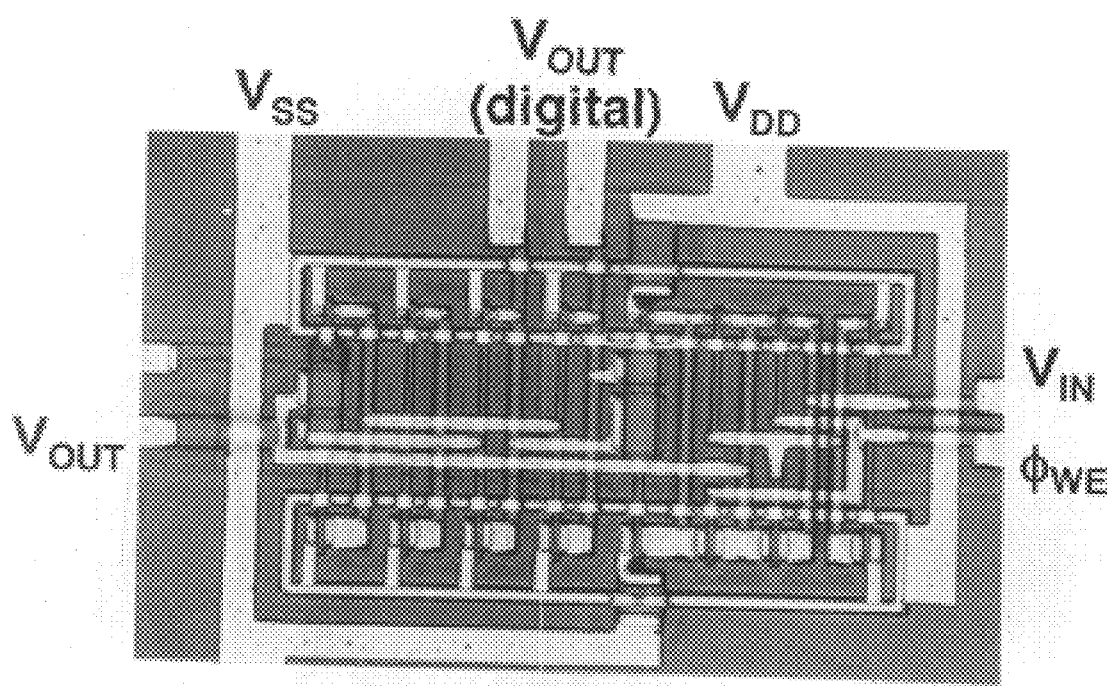
FIG. 18 is an image of an experimentally produced multilevel memory.
Figure 19:
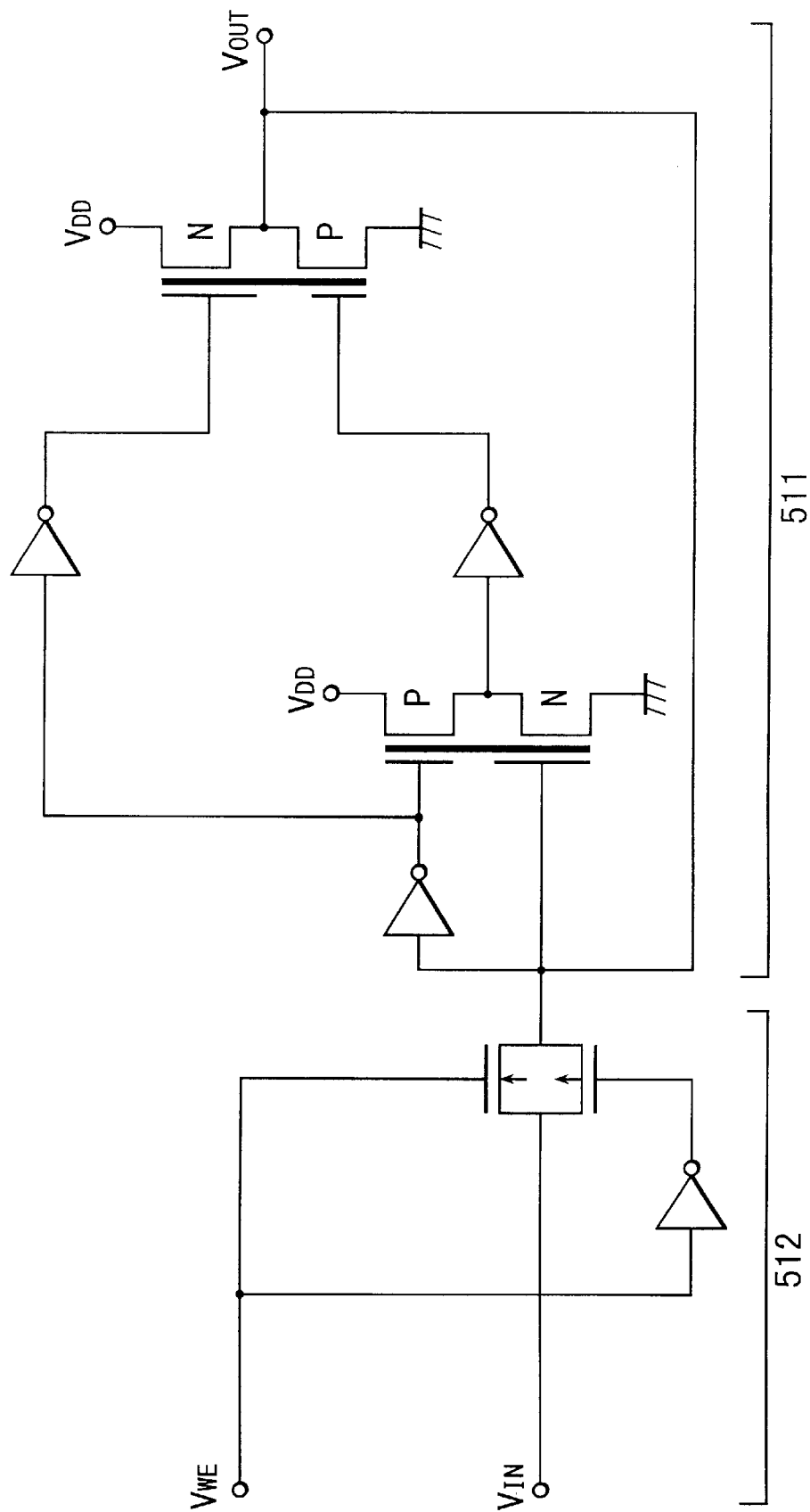
FIG. 19 is a circuit diagram of an experimentally produced multilevel memory.

FIGS. 18 and 19 are, respectively, an image of a chip and a circuit diagram referring to the experimental production of a multilevel memory using this basic principle. Reference 511 indicates a circuit connecting $V_{IN}$ and $V_{OUT}$ in FIG. 16, while reference 512 indicates a circuit for fetching input signals from the exterior to the circuit.

When $V_{WE}$ ($\Phi_{WE}$) has a value of '1', then $V_{IN}$ is fetched by the circuit, while when $V_{WE}$ ($\Phi_{WE}$) has a value of '0', then $V_{OUT}$ changes to a stable state which is closest to the $V_{IN}$ which was fetched and this value is latched.

Figure 20:
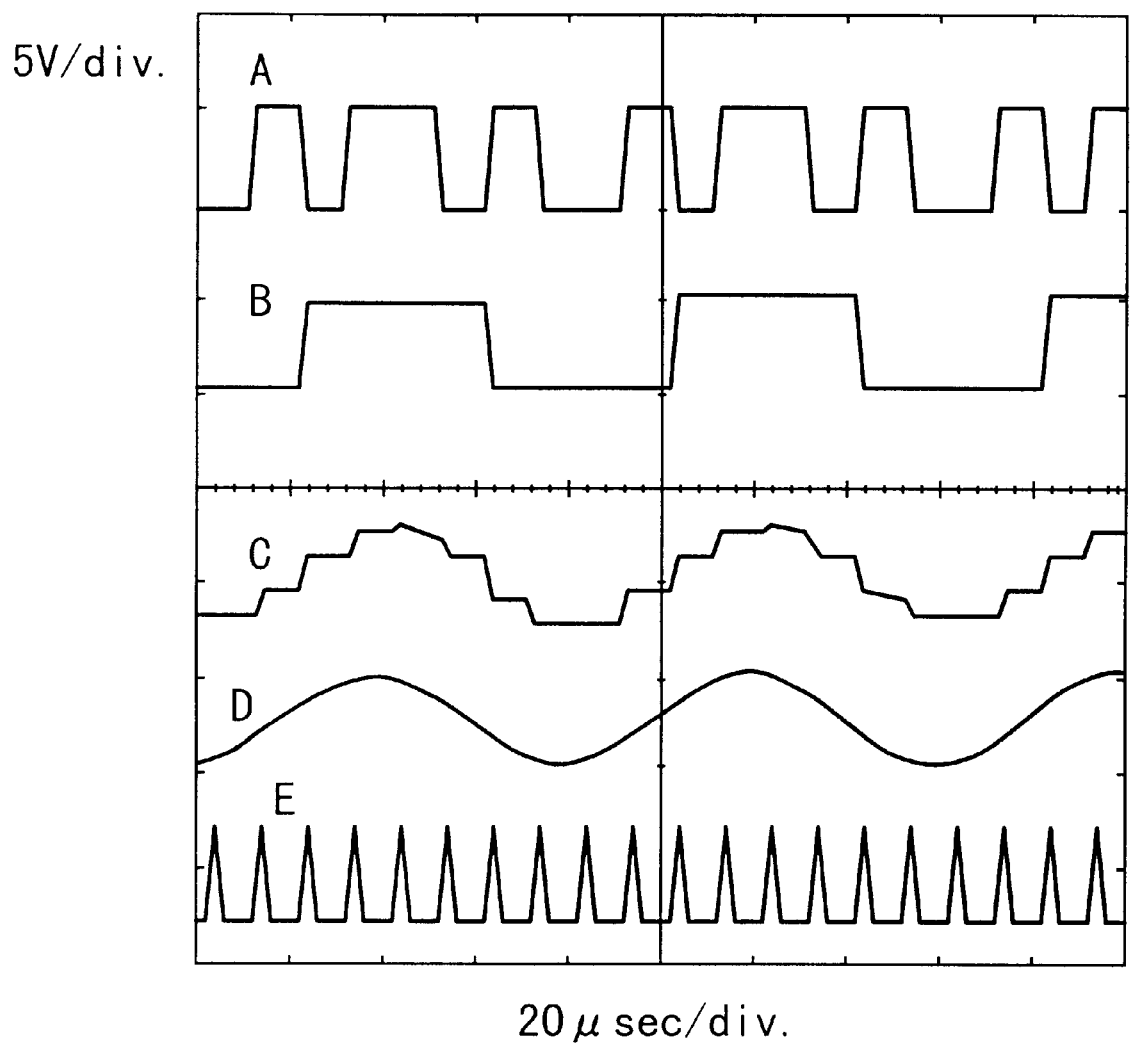
FIG. 20 is a graph showing the characteristics of the multilevel memory.

FIG. 20 shows measurement results; the wave form labeled D represents $V_{IN}$, wile the wave form labeled E represents $V_{WE}$, and when this has a value of '1' the voltage D at this time is fetched by the circuit. A and B indicate the output of the two bit A/D converter, and C represents $V_{OUT}$. It can be seen that the voltage fetched by the circuit is latched.

In all the neuron MOS transistors described above, it is possible to add a switch to the floating gate of all circuits and to appropriately initialize the potential of the floating gate to a freely selected potential. Furthermore, it is of course the case that the r source voltages, threshold values of transistors, and ratios or values of the capacities may employ freely selected values other than those shown in the examples, in accordance with design requirements.

Industrial Applicability

By means of the present invention, it is possible to realize a multilevel memory in a simple manner, and moreover, realization is possible using an extremely small number of transistors and in a voltage mode by means of the use of neuron MOS transistors, so that LSI becomes a simple matter.

Accordingly, it will be possible to develop applications in a wide range of fields, from the field of image processing, which requires high speed and real time processing to new circuit architectures which employ multilevels, and the like.

We claim:

1. A semiconductor circuit, comprising:
   a first circuit having an input and an output, said first circuit being responsive to a first signal applied to said input for generating at said output a signal group comprising at least one quantizing signal representing a quantization of said first signal; and
   a second circuit having an input and an output, said second circuit being responsive to said signal group generated by said first circuit for producing a second signal comprising a multilevel signal in accordance with the respective quantization values of said at least one quantizing signal and providing said second signal at the output of said second circuit;
   wherein the output of said second circuit is selectively coupled to the input of said first circuit.

2. A semiconductor circuit in accordance with claim 1 in which said first circuit comprises a plurality of CMOS inverters having differing inversion threshold values, and said second circuit has a function of outputting a multilevel signal in accordance with values of 1 or 0 outputted by said CMOS inverters.

3. A semiconductor circuit in accordance with claim 1, in which said first circuit comprises an A/D converter for converting an inputted signal into a plurality of weighted binary digital signals, and said second circuit comprises a D/A converter for converting said plurality of weighted binary digital signals into a multilevel signal.

4. A semiconductor circuit in accordance with claim 1, in which at least one of said first circuit and said second circuit comprises one or more neuron MOS transistors provided with: a semiconducting region of one conductivity type provided on a substrate, source and drain regions of another conductivity type opposite to said one conductivity type provided in said semiconducting region, a floating gate electrode having a floating potential, said floating gate eletrode being isolated from said source and drain regions and being coupled to said semiconducting region via a first insulating film, and a plurality of input gate electrodes which are capacitively coupled with said floating gate electrode via a second insulating film.

5. A semiconductor circuit in accordance with claim 4, in which said second circuit comprises an N type neuron MOS transistor and a P type neuron MOS transistor having a common floating gate, the sources of which are connected to one another, wherein said signal group is coupled to said input gate electrodes, and the drain of said N type MOS transistor has a higher potential than the drain of said P type MOS transistor.

6. A semiconductor circuit in accordance with claim 4, in which said second circuit comprises an N type neuron MOS transistor and a P type neuron MOS transistor having a common floating gate, the drains of which are connected to one another, wherein said signal group is coupled to said input gate electrodes, and the source of said P type MOS transistor has a higher potential than the source of said N type MOS transistor.

7. A semiconductor circuit in accordance with claim 2, in which at least one of said first circuit and said second circuit comprises one or more neuron MOS transistors provided with: a semiconducting region of one conductivity type provided on a substrate, source and drain regions of another conductivity type opposite to said one conductivity type provided in said semiconducting region, a floating gate electrode having a floating potential, said floating gate electrode being isolated from said source and drain regions and being coupled to said semiconducting region via a first insulating film, and a plurality of input gate electrodes which are capacitively coupled with said floating gate electrode via a second insulating film.

8. A semiconductor circuit in accordance with claim 7, in which said second circuit comprises an N type neuron MOS transistor and a P type neuron MOS transistor having a common floating gate, the sources of which are connected to one another, wherein said signal group is coupled to said input gate electrodes, and the drain of said N type MOS transistor has a higher potential than the drain of said P type MOS transistor.

9. A semiconductor circuit in accordance with claim 7, in which said second circuit comprises an N type neuron MOS transistor and a P type neuron MOS transistor having a common floating gate, the drains of which are connected to one another, wherein said signal group is coupled to said input gate electrodes, and the source of said P type MOS transistor has a higher potential than the source of said N type MOS transistor.

10. A semiconductor circuit in accordance with claim 3, in which at least one of said first circuit and said second circuit comprises one or more neuron MOS transistors provided with:
    a semiconducting region of one conductivity type provided on a substrate, source and drain regions of another conductivity type opposite to said one conductivity type provided in said semiconducting region, a floating gate electrode having a floating potential, said floating gate electrode being isolated from said source and drain regions and being coupled to said semiconducting region via a first insulating film, and a plurality of input gate electrodes which are capacitively coupled with said floating gate electrode via a second insulating film.

11. A semiconductor circuit in accordance with claim 10, in which said second circuit comprises an N type neuron MOS transistor and a P type neuron MOS transistor having a common floating gate, the sources of which are connected to one another, wherein said signal group is coupled to said input gate electrodes, and the drain of said N type MOS transistor has a higher potential than the drain of said P type MOS transistor.

12. A semiconductor circuit in accordance with claim 10, in which said second circuit comprises an N type neuron MOS transistor and a P type neuron MOS transistor having a common floating gate, the drains of which are connected to one another, wherein said signal group is coupled to said input gate electrodes, and the source of said P type MOS transistor has a higher potential than the source of said N type MOS transistor.

* * * * *